United States Patent
Yu et al.

(10) Patent No.: US 10,236,446 B2
(45) Date of Patent: Mar. 19, 2019

(54) MANUFACTURING APPARATUS FOR FLEXIBLE ELECTRONICS

(71) Applicant: ROYOLE CORPORATION, Fremont, CA (US)

(72) Inventors: Xiaojun Yu, Fremont, CA (US); Ze Yuan, Fremont, CA (US); Peng Wei, Fremont, CA (US); Zihong Liu, Fremont, CA (US)

(73) Assignee: SHENZHEN ROYOLE TECHNOLOGIES CO. LTD., Shenzhen, Guangdong (CN)

( * ) Notice: Subject to any disclaimer, the term of this patent is extended or adjusted under 35 U.S.C. 154(b) by 0 days.

(21) Appl. No.: 15/574,788

(22) PCT Filed: Jun. 8, 2016

(86) PCT No.: PCT/US2016/036511
§ 371 (c)(1),
(2) Date: Nov. 16, 2017

(87) PCT Pub. No.: WO2016/200991
PCT Pub. Date: Dec. 15, 2016

(65) Prior Publication Data
US 2018/0145255 A1    May 24, 2018

Related U.S. Application Data

(60) Provisional application No. 62/173,929, filed on Jun. 10, 2015, provisional application No. 62/173,090, filed on Jun. 9, 2015.

(51) Int. Cl.
*B32B 43/00* (2006.01)
*H01L 51/00* (2006.01)
(Continued)

(52) U.S. Cl.
CPC ............ *H01L 51/003* (2013.01); *H01L 27/12* (2013.01); *H01L 51/00* (2013.01);
(Continued)

(58) Field of Classification Search
CPC ............ B32B 43/006; Y10T 156/1132; Y10T 156/1168; Y10T 156/1944; Y10T 156/1978; Y10S 156/93; Y10S 156/941
See application file for complete search history.

(56) References Cited

U.S. PATENT DOCUMENTS 8,360,129 B2 * 1/2013 Ebata .................. B65H 41/00
156/714
8,951,387 B2 * 2/2015 Kang .................. B29C 63/0013
156/712
(Continued)

FOREIGN PATENT DOCUMENTS

CN    103560101 A    2/2014
CN    104425320 A    3/2015
(Continued)

OTHER PUBLICATIONS

Royole Corporation, International Search Report and Written Opinion, PCT/US2016/036511, dated Aug. 24, 2016, 10 pgs.
(Continued)

*Primary Examiner* — Mark A Osele
(74) *Attorney, Agent, or Firm* — Morgan, Lewis & Bockius LLP

(57) ABSTRACT

This application discloses a method of forming a flexible substrate using a detachment apparatus. The flexible substrate includes a debonding region, and one or more edge regions located in proximity to one or more edges of the flexible substrate. The detachment apparatus detaches the one or more edge regions of the flexible substrate from a rigid carrier that is configured to support the flexible sub-
(Continued)

strate device, and detach the debonding region of the flexible substrate from the rigid carrier to which a bottom surface of the debonding region is configured to adhere. Specifically, the detachment apparatus detaches the debonding region by contacting the top surface of the flexible substrate at a plurality of suction locations located on the debonding region of the flexible substrate, and applying detachment force at the plurality of suction locations to peel the flexible substrate off the rigid carrier.

22 Claims, 14 Drawing Sheets

(51) Int. Cl.
    *H01L 27/12*     (2006.01)
    *H01L 51/56*     (2006.01)
    *H01L 27/32*     (2006.01)

(52) U.S. Cl.
    CPC .......... *H01L 51/0097* (2013.01); *H01L 51/56* (2013.01); *H01L 27/3244* (2013.01); *H01L 2227/326* (2013.01); *H01L 2251/5338* (2013.01); *Y02E 10/549* (2013.01); *Y02P 70/521* (2015.11); *Y10S 156/93* (2013.01); *Y10S 156/941* (2013.01); *Y10T 156/1132* (2015.01); *Y10T 156/1168* (2015.01); *Y10T 156/1944* (2015.01); *Y10T 156/1978* (2015.01)

(56) References Cited

U.S. PATENT DOCUMENTS

| | | | |
|---|---|---|---|
| 8,991,463 B2* | 3/2015 | Jeong | B29C 63/0013 |
| | | | 156/715 |
| 9,393,769 B2* | 7/2016 | Koo | B32B 43/006 |
| 9,475,270 B2* | 10/2016 | Xie | B32B 43/006 |
| 2011/0279417 A1 | 11/2011 | Kang et al. | |
| 2013/0071650 A1 | 3/2013 | Liu et al. | |
| 2015/0059986 A1* | 3/2015 | Komatsu | B26D 3/08 |
| | | | 156/510 |
| 2015/0076458 A1 | 3/2015 | Lee et al. | |
| 2015/0122427 A1 | 5/2015 | Koo et al. | |
| 2015/0319893 A1* | 11/2015 | Ohno | B32B 43/006 |
| | | | 156/702 |
| 2016/0016397 A1 | 1/2016 | Xie et al. | |

FOREIGN PATENT DOCUMENTS

| | | | |
|---|---|---|---|
| JP | 2012079836 A | 4/2012 | |
| KR | 20120053601 A | 5/2012 | |
| KR | 20130021533 A | 3/2013 | |
| WO | WO 2015067041 A1 * | 5/2015 | ........... B32B 43/006 |

OTHER PUBLICATIONS

Royole Corporation, First Office Action, CN201680033306.4, Dec. 3, 2018, 9 pgs. —No English Translation Available —.

* cited by examiner

MANUFACTURING APPARATUS FOR FLEXIBLE ELECTRONICS

CROSS REFERENCE TO RELATED APPLICATIONS

This Application is a United States National Stage Application filed under 35 U.S.C. § 371 of PCT Patent Application Serial No. PCT/US2016/036511 filed on Jun. 8, 2016, which claims the benefit of and priority to U.S. Provisional Patent Application No. 62/173,090 filed on Jun. 9, 2015, and U.S. Provisional Patent Application No. 62/173,929 filed on Jun. 10, 2015, which are hereby incorporated by reference in their entireties.

TECHNICAL FIELD

This application relates generally to flexible substrates of electronic devices, and more specifically, to flexible substrate structures, associated manufacturing methods and handling apparatuses that enable easy detachment of flexible substrates from rigid carriers after the electronic devices have been manufactured on the flexible substrates with the support of the rigid carriers.

BACKGROUND

Thin and flexible electronic devices are of great interest for application in wearable devices, electronic newspapers, smart identity cards and many other consumer electronics. One example of such flexible electronic devices is active matrix organic light emitting diode (AMOLED) displays. Specifically, in the AMOLED displays, thin film transistor (TFT) devices are made on flexible substrates by depositing thin films of an active semiconductor layer in conjunction with dielectric insulation layers and metallic contacts. The flexible substrates are temporarily attached to rigid carriers that provide sufficient mechanical support to the flexible substrates during the course of preparing the TFT devices and the corresponding AMOLED displays. After the TFT devices and the corresponding AMOLED displays are formed on the flexible substrates, the flexible substrates have to be detached from the rigid carriers without causing damages to the TFT devices or display elements of the AMOLED displays formed thereon.

An excimer laser has often been applied to release a flexible substrate from a rigid carrier. Specifically, the excimer laser has been used to treat an interface between the flexible substrate and the rigid carrier when the flexible substrate is formed directly on the rigid carrier, or to treat a sacrificial layer when the flexible substrate is coupled to the rigid carrier via the sacrificial layer. However, the use of the excimer laser is normally associated with a high tool cost, and does not have a high production yield to provide a satisfactory throughput of the flexible substrate and sensitive to the particles. Alternatively, some prior art manufacturing methods manage to hold a flexible substrate at its edge and mechanically peel the flexible substrate off the underlying rigid carrier, which therefore involves a significantly less tool cost than the use of the excimer laser. However, there has always been a challenge to control mechanical force applied on the edge of the flexible substrate so as to avoid damage to a substrate area close to the edge while still providing sufficiently strong mechanical force to detach the entire flexible substrate from the rigid carrier.

Therefore, it would be beneficial to have an apparatus that facilitates detachment a flexible substrate from a rigid carrier while not compromising the yield of the flexible substrate and the quality of display devices formed thereon during a display manufacturing process.

SUMMARY

Accordingly, there is a need for an apparatus that facilitates detachment a flexible substrate from a rigid carrier and guarantees the yield of the flexible substrate and the quality of display devices formed thereon during a display manufacturing process. Specifically, in one aspect of the application, a detachment apparatus is designed to have a panel, a rod and a rod shaft, and can be used to facilitate flexible substrate detachment. The panel is configured for vacuum suction and includes a plurality of vacuum suction holes located on and distributed across a bottom surface of the panel. The rod is mechanically coupled to the panel and configured to hold the panel at a first end of the rod. The rod further includes a second end opposing the first end, and the rotation shaft is mechanically coupled to the second end of the rod and configured to hold the rod at the second end. As such, the panel is configured for contacting a top surface of a flexible substrate, applying force at a plurality of suction locations corresponding to the plurality of vacuum suction holes, and peeling the flexible substrate off the rigid carrier. In some embodiments, the functions of the panel can be replaced by an array of suction pads each including one or more vacuum suction holes, and suction pads in the array of suction pads can be controlled individually or in group during the course of peeling the flexible substrate off the rigid substrate.

Further, adhesion force between the flexible substrate and the rigid carrier could also be controlled so as to ease the mechanical detachment by the apparatus while still maintaining sufficiently strong attachment of the flexible substrate to the rigid carrier for the purposes of supporting the display manufacturing process. As such, the flexible substrate is supported by the rigid carrier in a sufficiently robust manner so as to facilitate manufacturing of display devices, and it is still easy to detach the flexible substrate from the rigid carrier using the apparatus without damaging the display devices after the display devices are formed on the flexible substrate.

In accordance with another aspect of this application, a method is implemented at a detachment apparatus for forming a flexible substrate that includes a debonding region and one or more edge regions. The method includes detaching the one or more edge regions of the flexible substrate from a rigid carrier that is configured to support the flexible substrate device. The one or more edge regions located in proximity to one or more edges of the flexible substrate. The method further includes after detaching the one or more edge regions, detaching the debonding region of the flexible substrate from the rigid carrier. More specifically, detaching the debonding region includes contacting the top surface of the flexible substrate at a plurality of suction locations located on the debonding region of the flexible substrate and applying detachment force at the plurality of suction locations to peel the flexible substrate off the rigid carrier.

This detachment apparatus facilitates detachment of a flexible substrate from a rigid carrier, and could guarantee the yield of the flexible substrate and the quality of display devices formed thereon during a display manufacturing process.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

Like reference numerals refer to corresponding parts throughout the several views of the drawings.

DESCRIPTION OF IMPLEMENTATIONS

Figure 1:
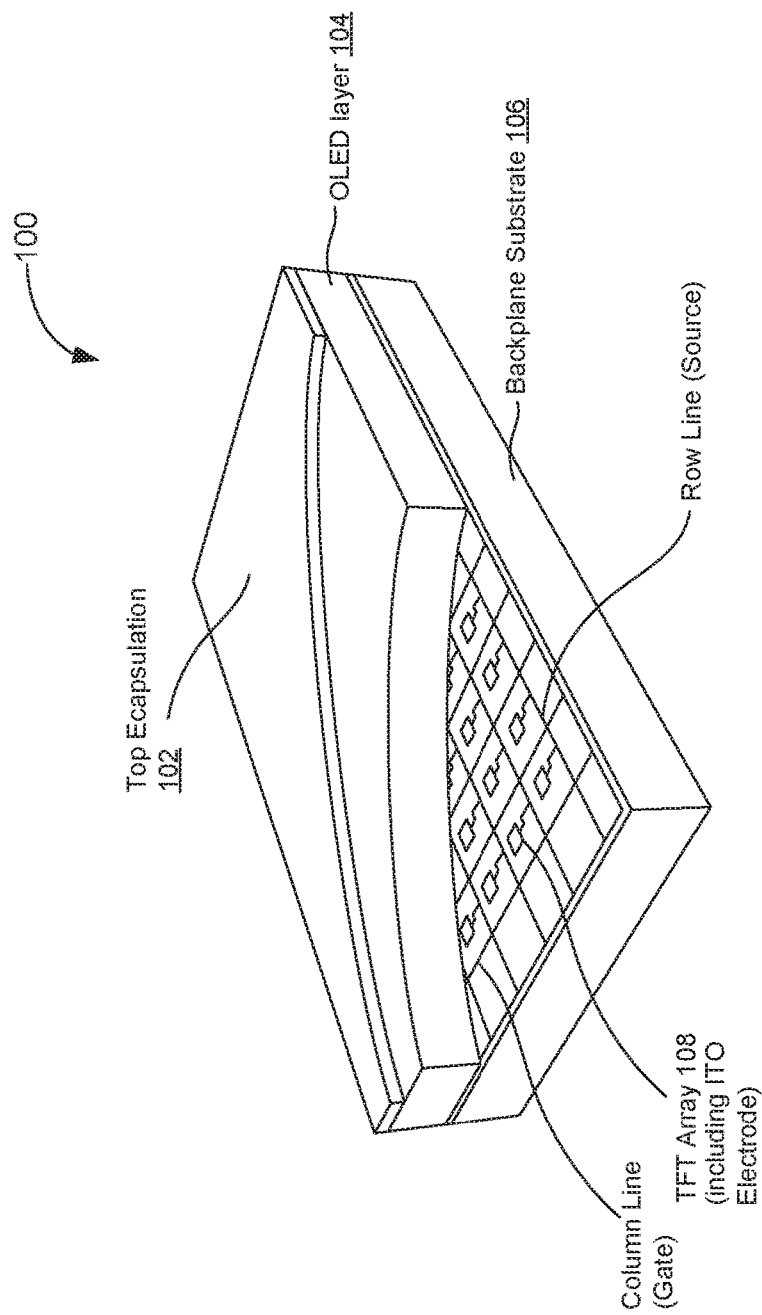
FIG. 1 is an example active matrix organic light emitting diode (AMOLED) display formed based on a flexible substrate in accordance with some implementations of the application.

In accordance with various implementations of the application, a flexible substrate is configured to adhere to a rigid carrier in a sufficiently robust manner, such that thin film transistor (TFT) devices and corresponding display devices can be manufactured on the flexible substrate while it is supported by the rigid carrier. After the TFT devices and the corresponding display devices are formed, the flexible substrate needs to be released from the rigid carrier without causing any damage to the TFT devices and the corresponding display devices formed thereon. In accordance with various embodiments of the application, a detachment apparatus is designed to facilitate flexible substrate detachment. The detachment apparatus functions based on vacuum suction; it includes a panel, a rod and a rod shaft. The panel is configured for vacuum suction, and includes a plurality of vacuum suction holes located on and distributed across a bottom surface of the panel. The rod is mechanically coupled to the panel and configured to hold the panel at a first end of the rod. The rod further includes a second end opposing the first end, and the rotation shaft is mechanically coupled to the second end of the rod and configured to hold the rod at the second end. Optionally, the rotation shaft is substantially parallel to the bottom surface of panel.

The panel of the detachment apparatus is configured for contacting a top surface of a flexible substrate, applying force at a plurality of suction locations corresponding to the plurality of vacuum suction holes, and peeling the flexible substrate off the rigid carrier. In some embodiments, the functions of the panel can be replaced by an array of suction pads each including one or more vacuum suction holes, and suction pads in the array of suction pads can be controlled individually or in group during the course of peeling the flexible substrate off the rigid substrate.

In a specific example, during the operation of the detachment apparatus, the detachment apparatus initiates peeling from an edge of a flexible substrate via laser release or mechanical cutting, picks up the flexible substrate from its front surface and completes a corresponding peeling process. The detachment apparatus is configured to control a peeling angle and peeling strength.

It is noted that a TFT array can be formed on a flexible substrate and act as integrated driver circuit to drive an organic light emitting diode (OLED) array. When the TFT array is assembled with the corresponding OLED array, each individual TFT device of the TFT array is aligned with and disposed in proximity to (e.g., above and adjacent to) a respective OLED display pixel driven by the respective TFT device. Specifically, each individual TFT device of the TFT array is electrically coupled to an OLED of the OLED array, and configured to generate an electrical signal to drive the OLED pixel. In some embodiments, the flexible substrate and the TFT array formed thereon are made of transparent materials, such that light emitted by the OLED or an external light source could provide illumination passing through the TFT array. In various embodiments of the application, a detachment apparatus is applied to detach the flexible substrate including the TFT array from a rigid carrier that is configured to support the flexible substrate during a manufacturing process. It is understood that this flexible substrate is not limited to a flexible substrate device related to the OLED array and could be part of any flexible electronic device having a flexible substrate.

FIG. 1 is an example active matrix organic light emitting diode (AMOLED) device 100 in accordance with some implementations of the application. AMOLED device 100 is formed based on an organic light emitting diode (OLED) layer 104, and further includes a top encapsulation layer 102 and a backplane substrate 106. AMOLED device 100 includes a two-dimensional (2D) array of OLED pixels that are formed on OLED layer 104 and controlled to emit light individually. Specifically, each OLED pixel includes respective organic compounds on OLED layer 104, and is configured to emit light when one or more TFT devices generate current that flows through the organic compounds corresponding to the respective OLED pixel. The 2D OLED pixel array has been used to create digital displays for electronic devices, including but not limited to televisions, computer monitors, tablet computers, mobile phones, and game consoles. Each AMOLED device 100 represents and is sometimes called a display panel device.

Top encapsulation layer 102 is configured to conceal and protect OLED layer 104. When AMOLED device 100 emits light from its top surface (i.e., via top encapsulation layer 102), top encapsulation layer 102 is made of transparent material. When AMOLED device 100 emits light from its bottom surface (i.e., via backplane substrate 106), top encapsulation layer 102 is optionally made of transparent or non-transparent material. Top encapsulation layer 102 includes a bottom surface that directly contacts OLED layer 104. In some embodiments, the bottom surface of top encapsulation layer 102 is coated with a layer of electrically conductive material that acts as a cathode (also called a common electrode) for the array of OLED pixels formed on OLED layer 104. The common electrode is made of material having a substantially low work function.

A thin film transistor (TFT) array 108 is formed on backplane substrate 106, and directly contacts OLED layer 104. TFT array 108 includes a two dimensional array of TFT drive units, row lines and column lines. Each TFT drive unit is connected to one of the row lines and one of the column lines. Each TFT drive unit of the TFT array 108 is electrically coupled to one or more OLEDs associated with a corresponding OLED pixel, and configured to generate an electrical current to drive the one or more OLEDs of the corresponding OLED pixel. Specifically, in some embodiments, each TFT drive unit includes at least two TFTs with a first TFT to control charging of a storage capacitor, and a second. TFT to couple the corresponding OLEDs to a voltage source at a level needed to create a substantially constant current within the corresponding OLEDs. This substantially constant current flow is controlled at each display pixel to trigger the luminescence (i.e., display at the respective display pixel).

In some embodiments, TFT array 108 is formed on backplane substrate 106. More specifically, a gate layer, a semiconductor layer, a source/drain layer, one or more conductive layers and one or more intervening insulating layers are deposited on backplane substrate 106. These material layers are lithographically patterned on backplane substrate 106 to form functional part (e.g., gate, source and drain) of TFTs of the TFT drive units as well as the row and column lines for accessing the TFT drive units in TFT array 108.

When AMOLED device 100 is rigid, at least one of top encapsulation layer 102 and backplane substrate 106 is made of rigid material (e.g., glass). In various embodiments of the application, AMOLED device 100 includes a flexible lightweight substrate, and is characterized by excellent portability and storage capacity, which increases portability of applications from small-area to large-area displays. Specifically, in a flexible AMOLED device 100, both top encapsulation layer 102 and backplane substrate 106 are made of flexible material (e.g., plastic).

Figure 2A:
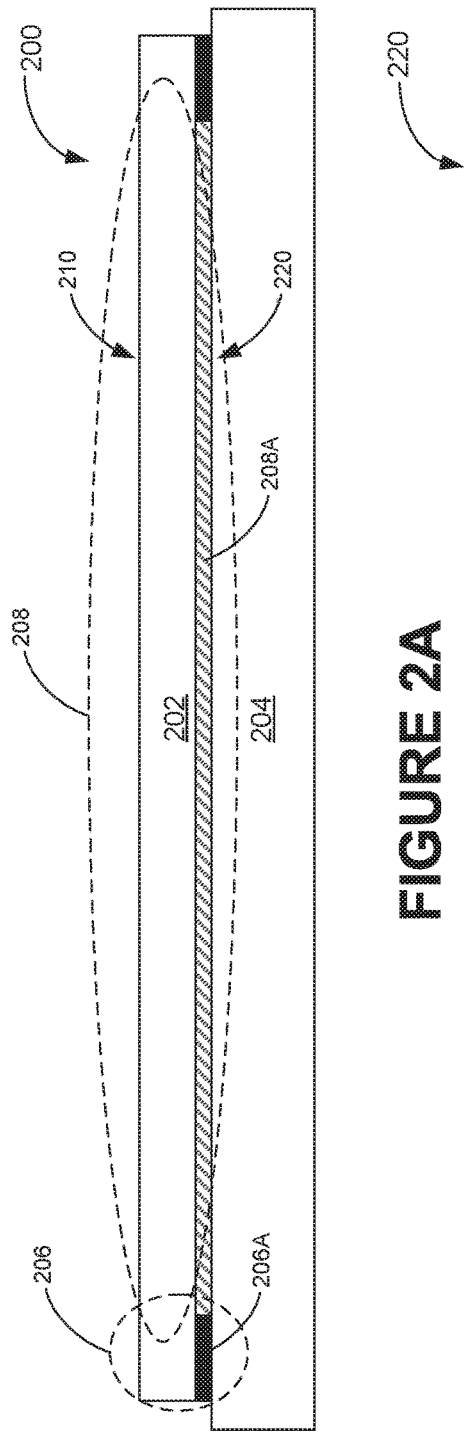
FIGS. 2A and 2B are a cross sectional view and a bottom view of an example flexible substrate that is supported by a rigid carrier during the course of manufacturing TFTs on the flexible substrate in accordance with some implementations, respectively.
Figure 2B:
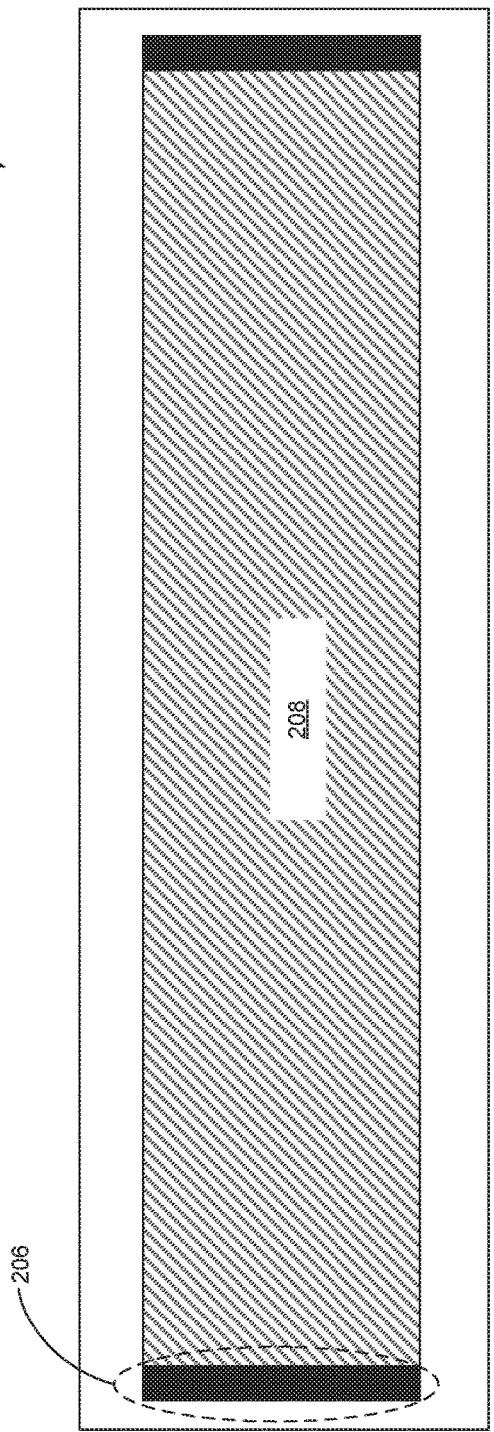

In accordance with various implementations of the application, a TFT array (e.g., a TFT array of an AMOLED device 100) is formed on a flexible substrate, while the flexible substrate is supported by a rigid carrier. The flexible substrate has to adhere to the rigid carrier in a sufficiently robust manner, such that thin film transistor (TFT) devices can be manufactured on the flexible substrate with the support of the rigid carrier. FIGS. 2A and 2B are a cross sectional view 200 and a bottom view 220 of an example flexible substrate 202 that is supported by a rigid carrier 204 during the course of manufacturing TFTs on the flexible substrate 202 in accordance with some implementations, respectively. Flexible substrate 202 could be made of polymeric material, including one or more of poly(methy methacrylate) (PMMA), poly(styrene), poly(vinyl phenol), silsesquioxane (glass resin), benzocyclobutene (BCB), polyimide, polynorbornene, polyamide, polyethersulfone, polyetherimide, polycarbonate, polyethelene naphthalate, polyester, acrylic polymer, nylon, and the like.

Flexible substrate 202 includes a top surface 210 and a bottom surface 220 that is opposite to top surface 210. A plurality of electronic devices is formed on top surface 210 of the flexible substrate. Optionally, the plurality of electronic devices includes one or more TFTs. More specifically, in some embodiments, the plurality of electronic devices includes a plurality of pixel drive circuits formed from the one or more TFTs, and each pixel drive circuit is configured to drive a display pixel of a display device, e.g., an AMOLED device 100. More details on a TFT formed on top surface 210 of flexible substrate 202 are discussed below with reference to FIG. 2C.

Flexible substrate 202 includes a debonding region 208 and one or more edge regions 208. The one or more edge regions 208 are located in proximity to one or more edges of flexible substrate 202. Bottom surface 220 of debonding region 208 is configured to adhere to the rigid carrier.

Bottom surface 220 of the one or more edge regions 206 further includes one or more strong adhesion regions 206A, and bottom surface 220 of debonding region 208 includes one or more normal adhesion regions 208A that are distinct from the one or more strong adhesion regions 206A. Each of the one or more strong adhesion regions 206A and the one or more normal adhesion regions 208A are configured to attach to the rigid carrier with a first adhesion strength and second adhesion strength, respectively. The first adhesion strength is substantially larger than the second adhesion strength. The adhesion strengths of the strong and normal adhesion regions are configured to ease detachment of flexible substrate 202 from the rigid substrate 204, after the plurality of electronic devices are formed on flexible substrate 202 or after one or more AMOLED devices 100 are formed based on the flexible substrate 202.

In some embodiments, the one or more normal adhesion regions 208A of flexible substrate 202 are not covered and include the same material as that of flexible substrate 202, i.e., the one or more normal adhesion regions 208A are directly disposed on rigid substrate 204 to obtain the second adhesion strength. Alternatively, in some embodiments, the one or more normal adhesion regions 208A are covered with a debonding layer made of a second adhesion reducing material to reduce adhesion strength between flexible substrate 202 and rigid carrier 204. Examples of the second adhesion reducing material include, but are not limited to silicon nitride (SiNx), a self assembled layer, an organic silane compound, and a combination thereof. More specifically, in some embodiments, the debonding layer is made of a metallic material configured to adhere to an inorganic material layer coated on rigid carrier 204; in some embodiments, the debonding layer is made of an inorganic material configured to adhere to a metallic layer coated on rigid carrier 204, and the inorganic material could be one of spin-on-glass, silicon oxynitride, silicon oxide, spin-on-dielectric and silicon nitride. Further, in some embodiments, debonding region 208 includes a first adhesion control layer (not shown in FIG. 2A) coupled between the debonding layer and the polymeric material of flexible substrate 202, and the first adhesion control layer could be one of a dielectric layer, a metal oxide layer, a self assembled layer, an adhesion promoter, a metal layer and a combination thereof.

In some embodiments, the one or more strong adhesion regions 206A are covered with a first adhesion enhancing material that provides the first adhesion strength. For example, the strong adhesion regions 206A could be covered with organic silane compound, hexamethyldisilazane (HMDS), silicon oxide (SiOx), silicon oxynitride (SiOxNy), indium tin oxide (ITO), indium zinc oxide (IZO), indium gallium zinc oxide (IGZO), indium gallium oxide (IGO), some other metal oxide, or a combination thereof. Alternatively, in some embodiments, the one more normal strong adhesion regions 206A include the same material as that of flexible substrate 202, i.e., flexible substrate 202 come into contact with rigid carrier 204 directly at the one or more strong adhesion regions 206.

In some embodiments, the one or more strong adhesion regions 206A and the one or more normal adhesion regions 208A are covered with two distinct materials to provide the first adhesion strength and the second adhesion strength, respectively.

Surface treatment could also be applied on a surface of rigid carrier 204 to enable the one or more strong and normal adhesion regions. Rigid carrier 204 includes one or more first surface areas to which the one or more strong adhesion regions 206A are attached, and one or more second surface areas to which the one or more normal adhesion regions 208A are attached. In some embodiments, the first surface areas of rigid carrier 204 are treated to form attachment with the one or more strong adhesion regions 206A with the first adhesion strength. In some embodiments, the second surface areas of rigid carrier 204 are treated to form attachment with the one or more normal adhesion regions 208A with the second adhesion strength. In some embodiments, both the first and second areas of rigid carrier 204 are treated, but treated differently to enable the first adhesion strength and the second adhesion strength, respectively. Each of the first and second surface areas of rigid carrier 204, if treated, can be treated physically using plasma or laser, or chemically using a surface treatment chemical.

Alternatively, surface treatment could also be applied on selected areas of bottom surface 220 of flexible substrate 202 to create the one or more strong adhesion regions 206A or the one or more normal adhesion regions 208A. When respective surface areas of bottom surface 220 corresponding to the strong and normal adhesion regions are treated, they are treated in different manners to enable the first adhesion strength and the second adhesion strength that are distinct from each other. Each of the strong and normal adhesion regions of flexible substrate 202, if treated, can be treated physically using plasma or laser, or chemically using a surface treatment chemical.

In some embodiments, the one or more edge regions 206 are configured to be detached from rigid carrier 204 via laser ablation or mechanical force. In some embodiments, debonding region 208 is configured to be mechanically peeled off rigid carrier 204 after the one or more strong adhesion regions 206A is detached from rigid carrier 204 using a detachment apparatus. The detachment apparatus includes a plurality of vacuum suction holes corresponding to a plurality of suction locations on top surface 210 of flexible substrate 202. Detachment force is applied at the plurality of suction locations to peel flexible substrate 202 off rigid carrier 204. More details on detachment apparatuses and methods of using them to form flexible substrates are discussed below with reference to FIGS. 3-11.

Flexible substrate 202 may further include a plurality of TFT arrays each of which is configured to drive a display panel device (e.g., an AMOLED device 100). In this specific implementation shown in FIGS. 2A and 2B, flexible substrate 202 includes a single normal adhesion region 206 that lies under the plurality of TFT arrays each of which is associated with an AMOLED display device 100. Flexible substrate 202 could be separated to the plurality of TFT arrays after it is released from rigid carrier 204. It is noted that flexible substrate 202 could also be separated to the plurality of TFT arrays while it is still supported by rigid carrier 204, and that each separated flexible substrate device 202 including one or more respective TFT arrays is released from rigid carrier 204 individually.

Figure 2C:
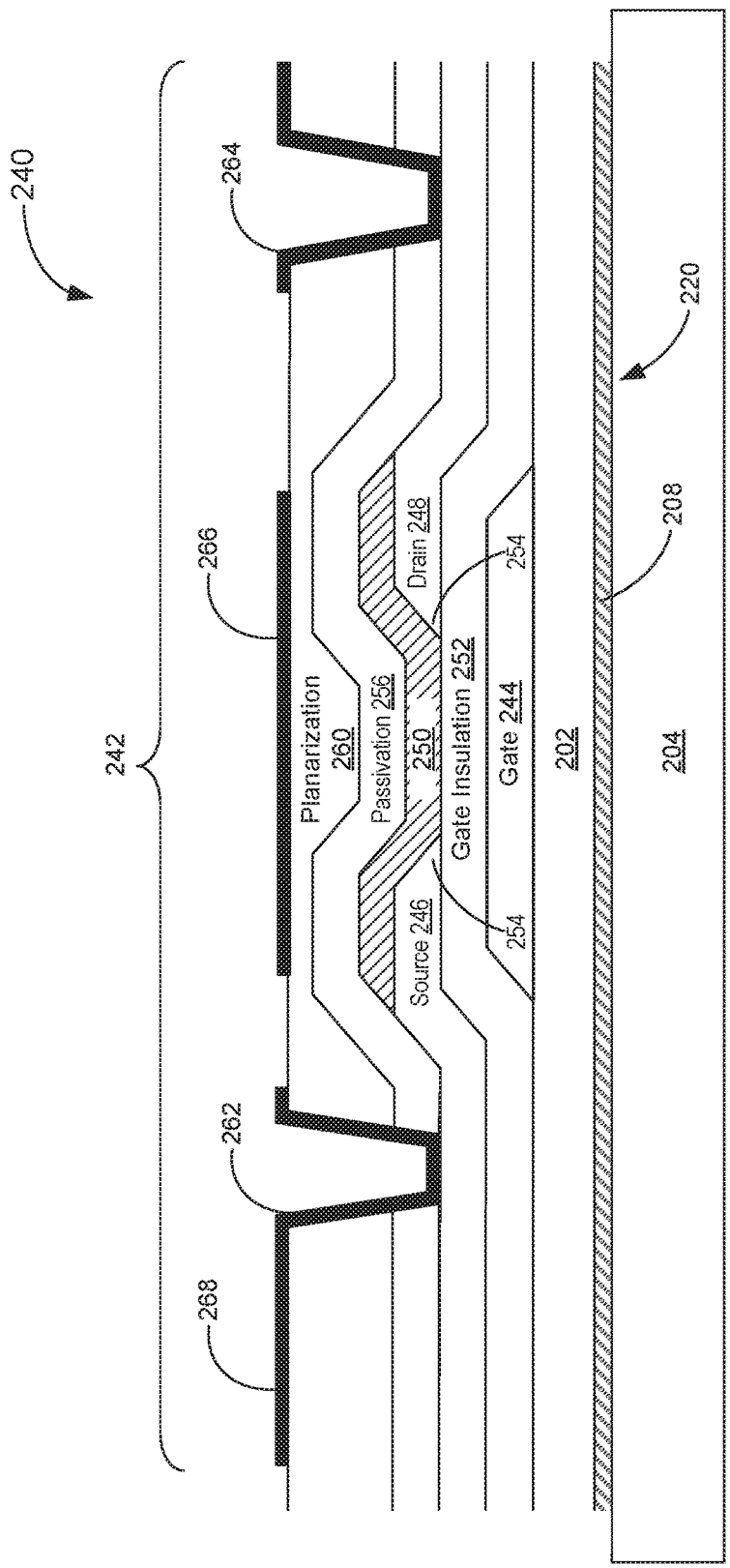
FIG. 2C is a cross sectional view of an example flexible substrate on which one or more TFTs are formed in accordance with some implementations.

FIG. 2C is a cross sectional view 240 of an example flexible substrate 202 on which one or more TFT devices 242 are formed in accordance with some implementations. In addition to the strong and normal adhesion regions on bottom surface 220, flexible substrate 202 further includes one or more TFT devices (e.g., TFT device 242) formed on top surface 210. TFT device 242 is located within one of a TFT array configured to drive an electronic system, e.g. AMOLED device 100, and the TFT array (including TFT device 242) is formed on part of top surface 210 corresponding to the normal adhesion regions 208 of bottom surface 220. TFT device 242 includes at least a gate 244, a source 246, a drain 248 and a channel structure 250. Gate 244 is formed on flexible substrate 202 and protected under a gate insulation layer 252. Source 246 and drain 248 lie above gate insulation layer 252, and are both electrically conductive. Each of source 246 and drain 248 includes a respective first edge 254 that defines a separation gap between source 246 and drain 248. In some embodiments, source 246 and drain 248 are patterned on a source/drain (S/D) material layer that is electrically conductive, and the separation gap is formed between source 246 and drain 248 after excessive part of the S/D material layer between source 246 and drain 248 is removed. It is understood that source 246 and drain 248 could lie above or below channel structure 250 although FIG. 2C shows example source 246 and drain 248 that lie under channel structure 250.

In some embodiments, TFT device 242 further includes passivation layer 256 that covers at least channel structure 250 for the purposes of protecting channel structure 250. Optionally, passivation layer 256 is made of a polymeric material or a dielectric material (e.g., silicon dioxide, silicon nitride, a low-k dielectric, and a combination thereof). Passivation layer 256 can include a single layer of material or multiple layers of distinct materials (e.g. a combination of one or more polymeric material layers and one or more dielectric material layers).

Further, in some embodiments, TFT device 242 could include passivation layer 260 that is disposed on passivation layer 256 and planarized to cover at least channel structure 250. Optionally, planarization layer 260 is substantially thicker than passivation layer 256. Planarization layer 260 can be a single layer or multiple layers of materials. In some embodiments, planarization layer 260 is made of a polymeric material. In some embodiments, planarization layer 260 is made of one or more of other inorganic materials such as metal (e.g., aluminum, molybdenum and titanium), metal oxide (e.g., aluminum oxide, titanium oxide and titanium nitride), dielectric (e.g., silicon dioxide, silicon nitride, and a low-k dielectric), spin on glass (SOG), spin on dielectric (SOD), silicon carbide (SiC), carbon-containing silicon oxide (SiOC), or any combination of two or more of these materials.

In some embodiments, TFT device 242 further includes an electrode layer that is formed on top surface 210 of flexible substrate 202 (i.e., on top of passivation layer 256 or planarization layer 260). The electrode layer is further patterned to, and thus includes a gate electrode (not shown in FIG. 2C), a source electrode 262 and a drain electrode 264 that are electrically coupled to gate 244, source 246 and drain 248, respectively. One or more gate contact openings are defined on passivation layer 256, passivation layer 256 and/or gate insulation layer 252 to allow the gate electrode to access gate 244. Similarly, source or drain contact openings are also defined on passivation layer 256 and passivation layer 256 to allow source electrode 262 or drain electrode 264 to access source 246 or drain 248, respectively.

Further, in some embodiments, the electrode layer disposed on top surface 210 of flexible substrate 202 further includes a top gate 266 formed above top channel 250, and separated from top channel 250 by both passivation layer 256 and planarization layer 260. In some embodiments, top gate 266 and gate 244 are electrically coupled to each other. Alternatively, in some embodiments, the electrode layer formed on top surface 210 of flexible substrate 202 further includes a pixel electrode 268 configured to drive a corresponding display pixel of a display device. The pixel electrode 268 is electrically coupled to the source electrode of TFT device 242 when TFT device 242 is configured to drive a display pixel of an AMOLED device 100.

It is noted that TFT device 242 described herein are exemplary and is not intended to be limiting. For example, any dimensions, materials, manufacturing operations and applications of TFT device 242 described herein are exemplary and are not intended to be limiting. Drawings are not to scale. For brevity, features or characters described in association with some implementations may not necessarily be repeated or reiterated when describing other implementations. Even though it may not be explicitly described therein, a feature or characteristic described in association with some implementations may be used by other implementations. Also, TFT device 242 described here is not limited to application in flexible display devices; rather, it could also be a transistor device used in any electronic device having a flexible substrate.

Figure 3:
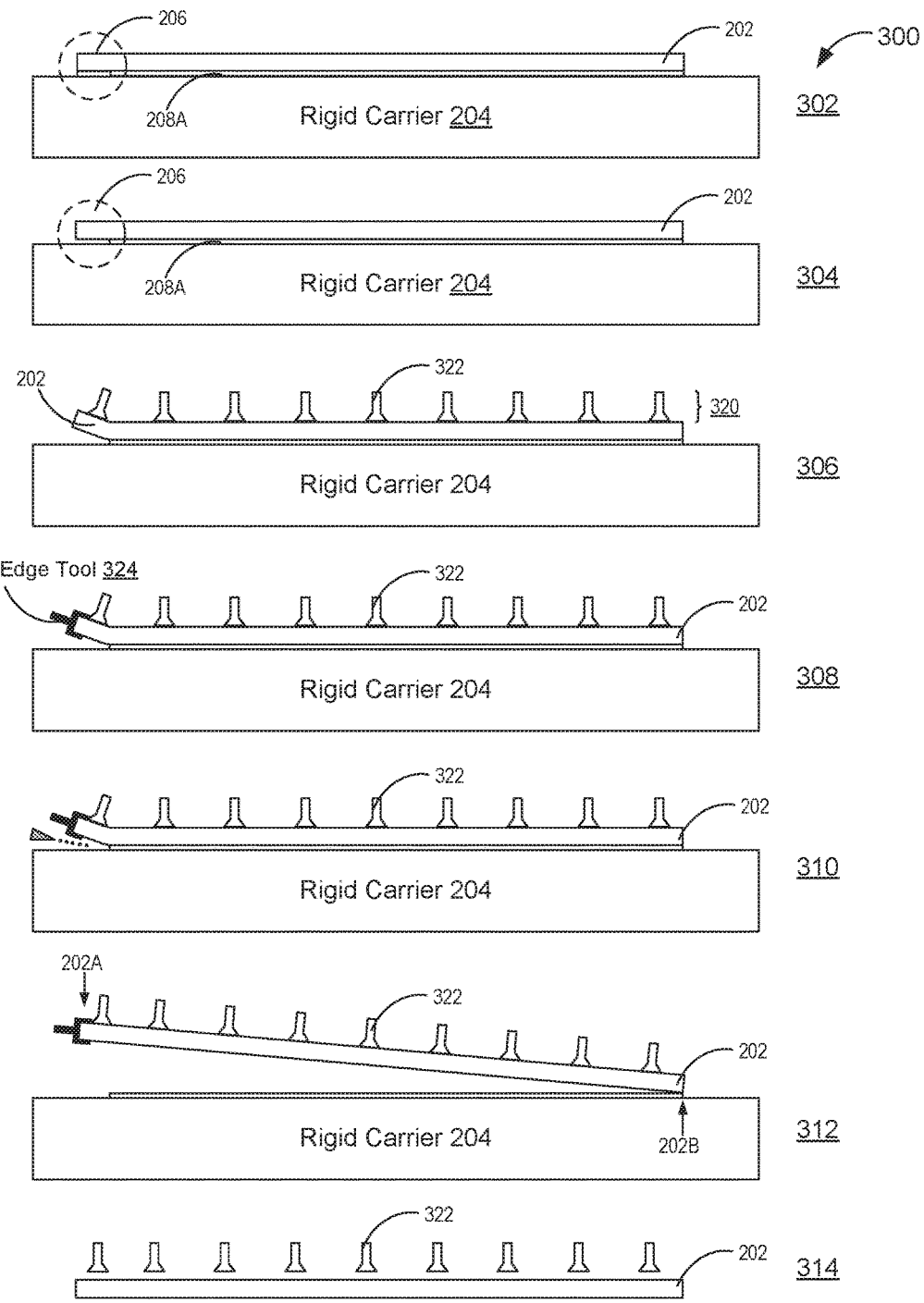
FIG. 3 is a flow diagram of an example process of manufacturing a flexible substrate using a detachment apparatus tool that includes a plurality of suction pads in accordance with some embodiments.

FIG. 3 is a flow diagram of a process 300 of manufacturing a flexible substrate using a detachment apparatus that includes a plurality of suction pads in accordance with some embodiments. Referring to FIGS. 2A-2C, flexible substrate 202 is formed (302) on top of rigid carrier 204 that is configured to support flexible substrate 202, and further includes one or more TFT devices 242 on its top surface 210. Flexible substrate 202 further includes one or more edge regions 206 and a debonding region 208. The debonding region 208 either comes into contact with rigid carrier 204 directly or is coupled to rigid carrier 204 via a debonding layer.

The one or more edge regions 206 are detached (304) from rigid carrier 204. Specifically, the one or more edge regions 206 are detached using laser liftoff (e.g., using laser ablation to reduce adhesion between the one or more edge regions 206 and rigid carrier 204, and using a laser to remove material between flexible substrate 202 and rigid carrier 204). The laser could also remove a thin layer from bottom surface 220 of flexible substrate 202 itself for the purposes of separating flexible substrate 202 and rigid carrier 204 at one or more edge regions 206. The one or more edge regions 206 have a width that is sufficient for subsequent substrate handling.

In some embodiments, the one or more edge regions 206 is peeled off using mechanical force, particularly where there is no functional device disposed on the one or more edge regions 206. In some embodiments, the one or more edge regions 206 are chemically treated before they are peeled off. For example, a groove or hole opening is cut on the one or more edge regions 206 to expose an interface between flexible substrate 202 and rigid carrier 204, and a debonding chemical is thereby injected into the opening cut on the one or more edge regions 206. As the debonding chemical reaches the exposed interface between flexible substrate 202 and rigid carrier 204, the one or more edge regions 206 are at least partially released from underlying rigid carrier 204.

A detachment apparatus 320 is applied to detach debonding region 208. Detachment apparatus 320 includes a plurality of suction pads 322 each further including one or more vacuum suction holes at its respective bottom surface. The one or more vacuum suction holes are connected to an air channel that is further connected to an air pump. When the air pump is turned on, air is pumped out of the air channel and the plurality of vacuum suction holes, thereby generating (306) mechanical force to hold flexible substrate 202 when vacuum pads 322 are placed in contact with a plurality of suction locations on top surface 210 of flexible substrate 202. The mechanical force generated by this air suction (also called vacuum suction) is configured to detach debonding region 208 of flexible substrate 202 from underlying rigid carrier 204. Here, the vacuum suction holes of the plurality of suction pads 322 are associated with the plurality of suction locations on top surface 210 of flexible substrate 202. It is noted that in various embodiments of this application, air is pumped from "vacuum suction holes" and the air channels connected thereto to generate detachment force, and however, such "vacuum suction" is not required to render a vacuum condition as far as force is generated and applied on flexible substrate 202.

In some embodiments, while the detachment force is applied at the plurality of suction locations, an edge tool 324 holds (308) the flexible substrate at the one or more edge regions to facilitate peeling the flexible substrate off the rigid carrier. Optionally, the detachment apparatus 320 extends to the one or more edge regions 206, and peels off the one or more edge regions 206 with or without the aid of the edge tool 324 before detaching debonding region 208. Further, in some embodiments, while flexible substrate 202 is peeled off rigid carrier 204, a debonding chemical is injected (310) under the one or more edge regions 206 and into an interface between rigid carrier 204 and debonding region 208 of flexible substrate 202. It is noted that the edge tool 324, the debonding chemical or both of them could be used to help release debonding region 208 from rigid substrate 204.

Then, detachment force is applied (312) at the plurality of suction locations to peel flexible substrate 202 off rigid carrier 204 from a first side 202A to a second side 202B. Also, edge tool 324, the debonding chemical or both of them are optionally used to help release debonding region 208 from rigid substrate 204. In some embodiments, the detachment force is applied by the suction pads 322 on the plurality of suction locations sequentially from first side 202A to second side 202B of flexible substrate 202, such that flexible substrate 202 is peeled off rigid carrier 204 gradually from first side 202A to second side 202B. The detachment force on each of the plurality of suction pads 322 could vary according to a set of factors (e.g., a suction pad density at the respective cup 322, a dimension of a vacuum suction hole, a location of the respective pad 322, a detachment force applied by edge tool 324, and strength of the debonding chemical).

When flexible substrate 202 is completely detached from rigid carrier 204, the detachment force is removed (314) from the plurality of suction pads 322 by discontinuing vacuum suction or blowing air through the plurality of suction pads. Flexible substrate 202 is then formed as a standalone device, and can be further processed as needed (e.g., being divided into two or more flexible substrate devices). When a debonding layer is used, the debonding layer is optionally detached with flexible substrate 202 or remains on the top surface of rigid carrier 204.

Figure 4A:
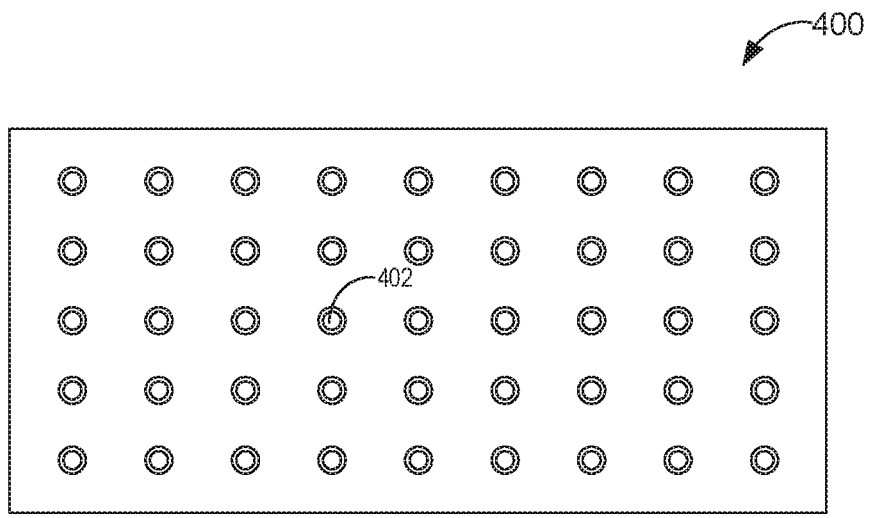
FIGS. 4A and 4B are top views of two example debonding regions each of which includes a plurality of suction locations in accordance with some embodiments.
Figure 4B:
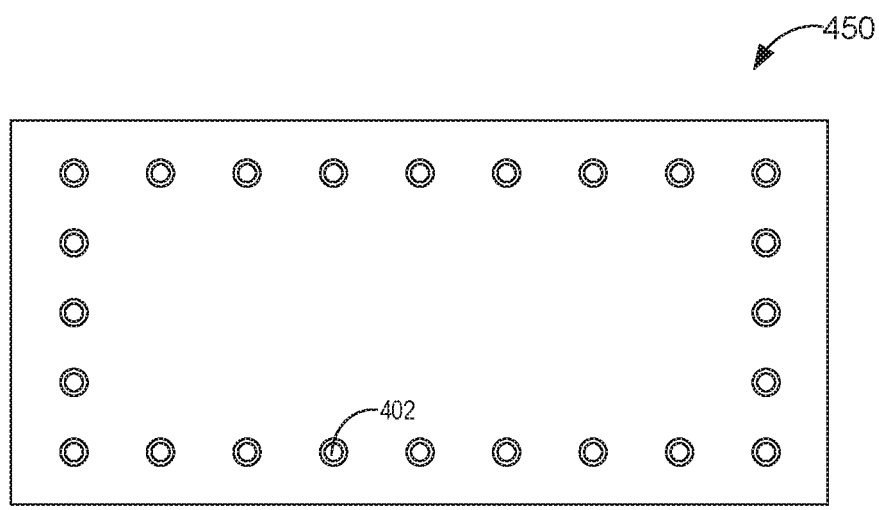

FIGS. 4A and 4B are top views of two example debonding regions 400 and 450 each of which includes a plurality of suction locations 402 in accordance with some embodiments. Optionally, the plurality of suction locations 402 is determined by and consistent with locations of vacuum suction holes of a detachment apparatus (e.g., tool 310 or tools shown is the other figures of this application). Optionally, the suction hole locations of the detachment apparatus are distinct from the plurality of suction locations 402 on flexible substrate 202, and detachment force is selectively applied on a subset of the plurality of suction locations.

In some embodiments, the plurality of suction locations are distributed evenly across top surface 210 of flexible substrate 202 (e.g., a two-dimensional array in FIG. 4A). Optionally, a subset of suction locations are associated with the one or more edge regions 206 to facilitate initial edge detachment.

In some embodiments, the plurality of suction locations are not distributed evenly across top surface 210 of flexible substrate 202 (e.g., a rectangular string in FIG. 4B). Here, the plurality of suction locations is selected as in proximity to four edges of flexible substrate 202 so as to allow the detachment apparatus to hold flexible substrate 202 on its edges. Unevenly distribution of the suction location could be determined by the suction hole locations of the detachment apparatus related to a design need of the detachment tool. For example, referring to FIG. 4B, the central open area surrounded by the rectangular string of suction locations may have to be reserved for a body of the detachment tool. Alternatively, the unevenly distribution of the suction location could also be related to a requirement to protect sensitive device areas. For example, the central open area surrounded by the rectangular string of suction locations may include sensitive TFT devices, and the vacuum suction holes of the detachment apparatus exist at locations corresponding to the central open area, but are not placed in contact with this area or do not apply detachment force on the locations in the central open area.

Figure 5A:
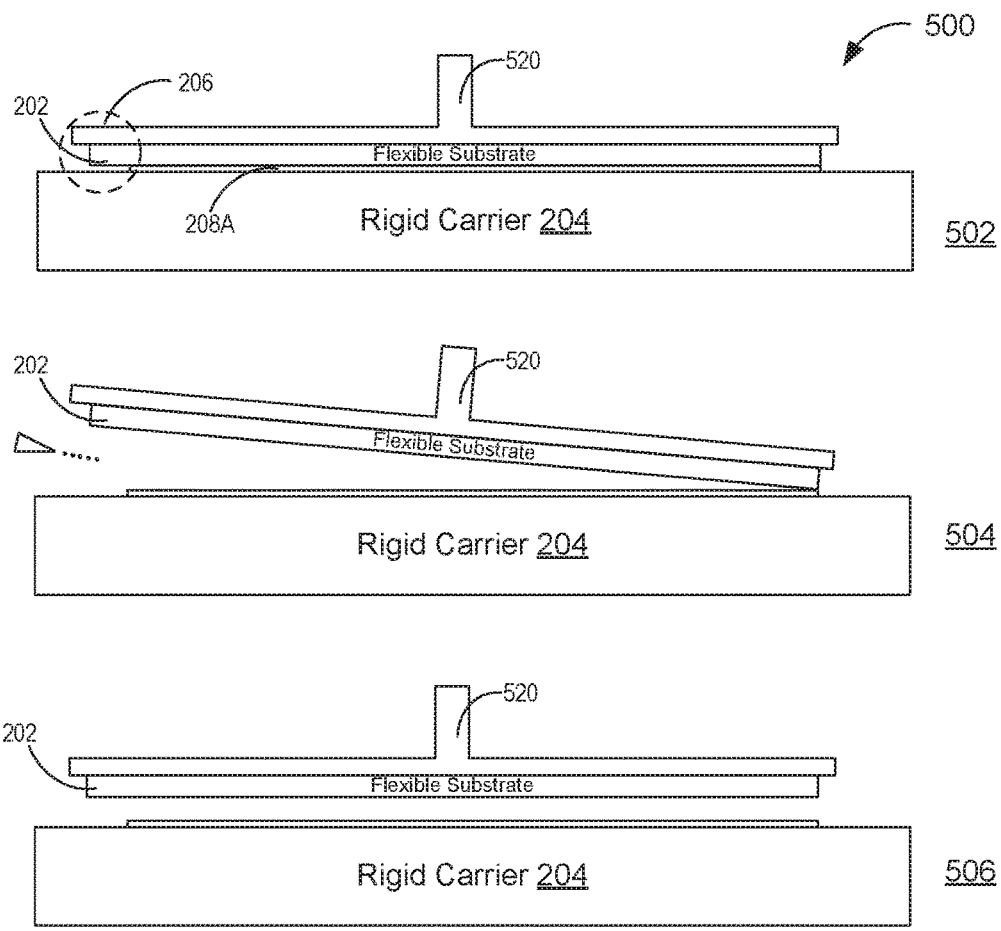
FIG. 5A is a flow diagram of an example process of manufacturing a flexible substrate using a detachment apparatus that includes a plurality of vacuum suction holes drilled on a substantially flat panel surface in accordance with some embodiments.
Figure 5B:
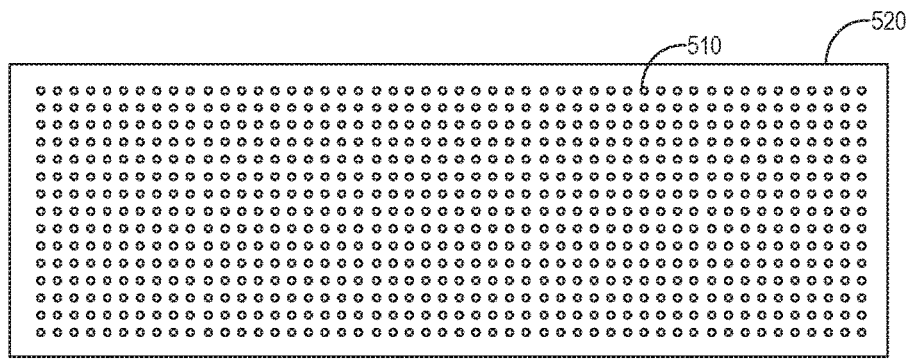
FIG. 5B is a bottom view of the detachment apparatus including the plurality of suction holes in accordance with some embodiments.

FIG. 5A is a flow diagram of a process 500 of manufacturing a flexible substrate using a detachment apparatus 520 that includes a plurality of vacuum suction holes 510 drilled on a substantially flat panel surface in accordance with some embodiments. FIG. 5B is a bottom view of the detachment apparatus 520 including the plurality of vacuum suction holes 510 in accordance with some embodiments. The plurality of vacuum suction holes 510 are evenly drilled on the substantially flat panel surface of a panel of the detachment apparatus 520. Although the plurality of vacuum suction holes 510 are all connected to an air pump, a first subset of the plurality of vacuum suction holes 510 could be disabled while a second subset of the plurality of vacuum suction holes 510 are actively connected to the air pump to enable detachment force applied on a set of suction locations of flexible substrate 202. Further, the plurality of vacuum suction holes 510 can be divided into groups, and the groups of vacuum suction holes 510 are activated at different times, for different durations and/or with different strengths to generate detachment force according to a force sequence. In some embodiments, each of the vacuum suction holes has a respective diameter less than 1 mm.

Flexible substrate 202 is formed on top of rigid carrier 204, and includes one or more edge regions 206 and a debonding region 208. After the one or more edge regions 206 are detached from rigid carrier 204 (e.g., by laser liftoff or mechanical force), the detachment apparatus 520 comes (502) into contact with top surface 210 of debonding region 208. Air is then pumped from a subset or all of the plurality of vacuum suction holes 510, thereby generating (502) mechanical force to hold flexible substrate 202 at a plurality of suction locations on flexible substrate 202 that are corresponding to the locations of the subset of or all vacuum suction holes 510. The mechanical force generated by this air suction (also called vacuum suction) is configured to detach debonding region 208 of flexible substrate 202 from underlying rigid carrier 204.

In some embodiments, the one or more edge regions 206 do not extend beyond a corresponding edge of detachment apparatus 520. While the detachment force is applied at the plurality of suction locations, an edge tool 324 holds the flexible substrate at the one or more edge regions 206 to facilitate peeling the flexible substrate off the rigid carrier. Further, in some embodiments, while flexible substrate 202 is peeled off rigid carrier 204, a debonding chemical is injected (504) under the one or more edge regions 206 and into an interface between rigid carrier 204 and debonding region 208 of flexible substrate 202. It is noted that the edge tool 324, the debonding chemical or both of them could be used to help release debonding region 208 from rigid substrate 204.

Detachment force is applied (504) at the plurality of suction locations to peel flexible substrate 202 off rigid carrier 204 from a first side 202A to a second side 202B. Also, edge tool 324, the debonding chemical or both of them is optionally used to help release debonding region 208 from rigid substrate 204. In some embodiments, the detachment force is applied by the detachment apparatus 520 on the plurality of suction locations sequentially from first side 202A to second side 202B of flexible substrate 202, such that flexible substrate 202 is peeled off rigid carrier 204 gradually from first side 202A to second side 202B. The detachment force on each of the plurality of vacuum suction holes 510 could vary according to a set of factors (e.g., a hole density at the respective vacuum hole 510, a dimension of the respective vacuum hole, a location of the respective vacuum hole 510, a detachment force applied by edge tool 324, and strength of the debonding chemical).

When flexible substrate 202 is completely detached from rigid carrier 204, the detachment force is removed (506) from the detachment apparatus 520. Flexible substrate 202 is formed as a standalone device, and can be further divided into two or more flexible substrate devices as needed. When a debonding layer is used, the debonding layer is optionally detached with flexible substrate 202 or remains on the top surface of rigid carrier 204.

Figure 6:
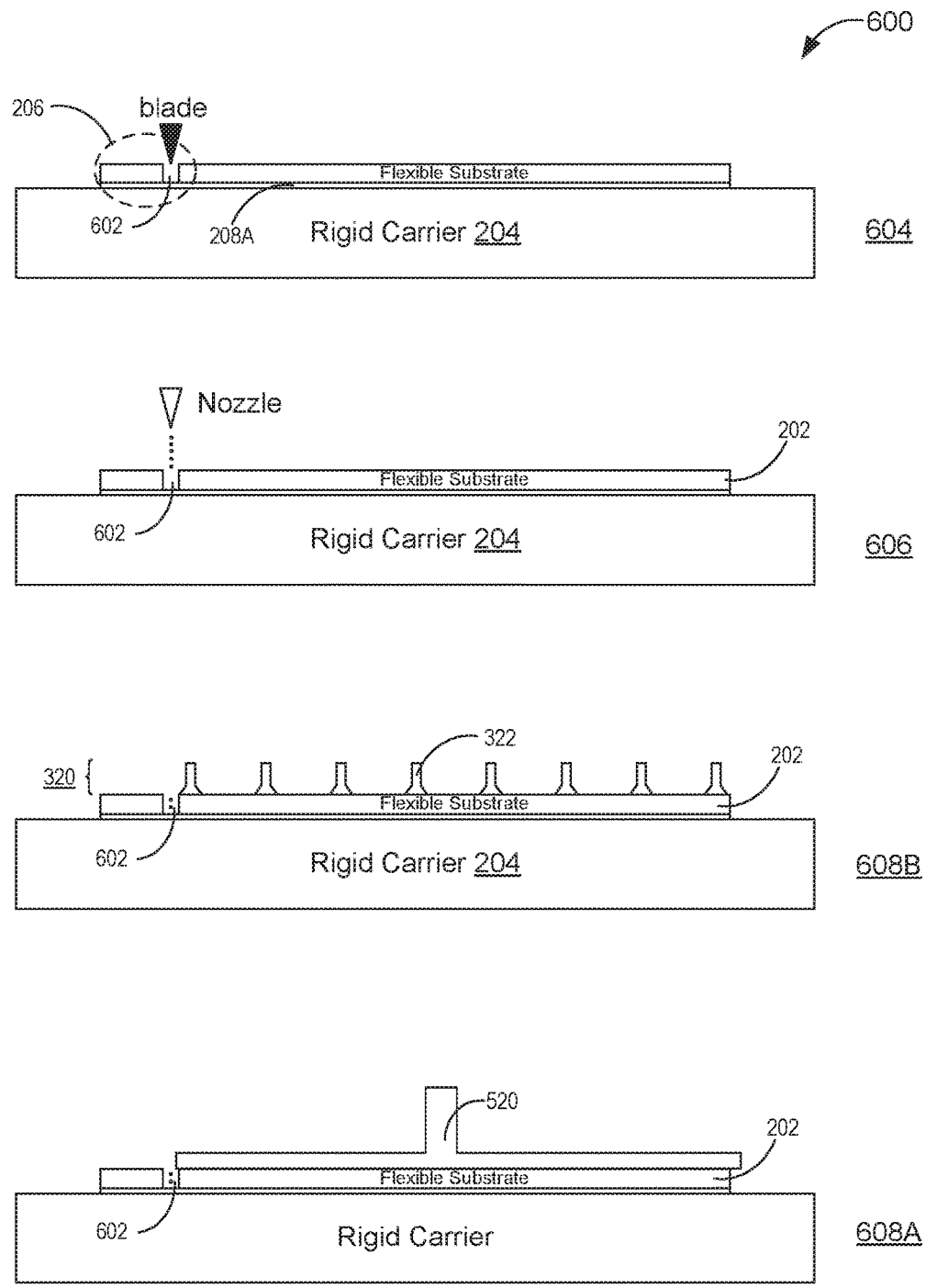
FIG. 6 is a flow diagram of an example process of manufacturing a flexible substrate based on edge release and vacuum suction in accordance with some embodiments.

FIG. 6 is a flow diagram of a process 600 of manufacturing a flexible substrate 202 based on edge release and vacuum suction in accordance with some embodiments. Prior to detachment of debonding region 208 from rigid substrate 204, the one or more edge regions 206 are detached from rigid carrier 204. Optionally, the one or more edge regions 206 are detached using laser liftoff (e.g., using laser ablation to reduce adhesion between the one or more edge regions 206 and rigid carrier 204). Optionally, the one or more edge regions 206 is peeled off using mechanical force, while the one or more edge regions 206 are optionally chemically treated before they are peeled off. For example, a groove or hole opening 602 is cut (604) on the one or more edge regions 206 to expose an interface between flexible substrate 202 and rigid carrier 204, and a debonding chemical is thereby injected into (606) the opening cut on the one or more edge regions 206. As the debonding chemical reaches the exposed interface between flexible substrate 202 and rigid carrier 204, the one or more edge regions 206 are at least partially released from underlying rigid carrier 204.

In some embodiments, the cut opening 602 is located substantially in proximity to an edge of debonding region 208. A detachment apparatus 320 benefits from the injection of the debonding chemical when the detachment apparatus 320 is applied to detach debonding region 208. Detachment apparatus 320 includes a plurality of suction pads 322 each further including one or more vacuum suction holes at its respective bottom surface. The plurality of suction pads 322 comes (608A) into contact with a plurality of suction locations on debonding region 208 of flexible substrate 202. The one or more vacuum suction holes of suction pads 322 are connected to an air channel that is further connected to an air pump. When the air pump is pumped out of the air channel and the plurality of vacuum suction holes, mechanical force is generated at the plurality of suction locations to hold flexible substrate 202. The mechanical force generated by this air suction (also called vacuum suction) is applied on debonding region 208 of flexible substrate 202 to detach it from underlying rigid carrier 204. During the course of detaching debonding region 208 of flexible substrate 202, the debonding chemical is optionally used to help release debonding region 208 from rigid substrate 204.

Alternatively, while the cut opening 602 is located substantially in proximity to an edge of debonding region 208, a detachment apparatus 520 is applied to detach debonding region 208. Detachment apparatus 520 includes a panel having a substantially flat or curved (not shown) panel surface and a rod configured to hold the panel at a first end. The panel includes a plurality of vacuum suction holes 510 connected to an air channel that is further connected to an air pump. The panel comes (608B) into contact with a plurality of suction locations on debonding region 208 of flexible substrate 202. When the air pump is pumped out of the air channel and the plurality of vacuum suction holes 510, mechanical force is generated at the plurality of suction locations on debonding region 206 to hold flexible substrate 202. The mechanical force generated by this air suction (also called vacuum suction) is applied on debonding region 208 of flexible substrate 202 to detach it from underlying rigid carrier 204. During the course of detaching debonding region 208 of flexible substrate 202, the debonding chemical is optionally used to help release debonding region 208 from rigid substrate 204.

Figure 7A:
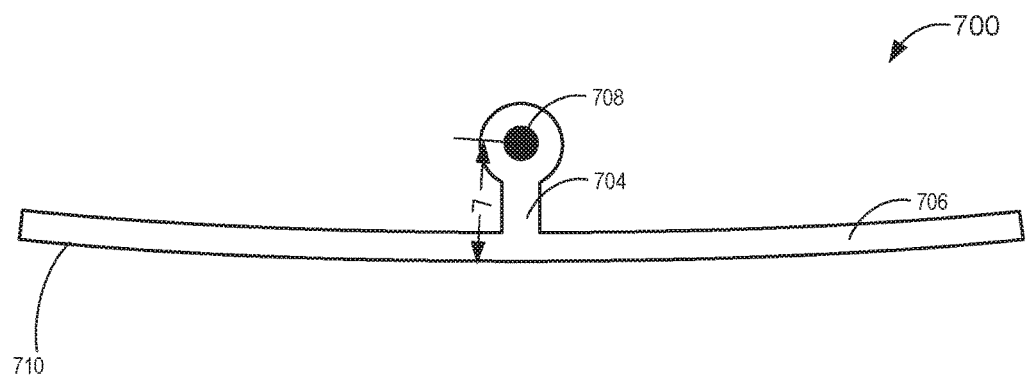
FIG. 7A is a side view of an example detachment apparatus that includes a plurality of vacuum suction holes drilled on a curved panel surface in accordance with some embodiments.
Figure 7B:
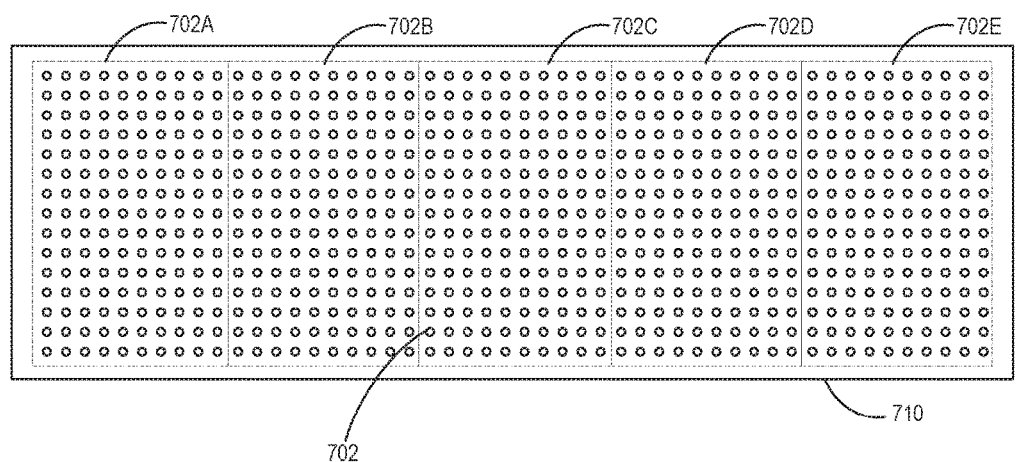
FIG. 7B illustrates the plurality of suction holes drilled on a curved panel surface of the detachment apparatus shown in FIG. 7A in accordance with some embodiments.

FIG. 7A is a side view of a detachment apparatus 700 that includes a plurality of vacuum suction holes 702 drilled on a curved panel surface 710 in accordance with some embodiments, and FIG. 7B illustrates the plurality of vacuum suction holes 702 drilled on the curved panel surface 710 of the detachment apparatus shown in FIG. 7A in accordance with some embodiments. The detachment apparatus 700 includes a rod 704 in addition to a panel 706 or a plurality of vacuum suction pads (e.g., suction pads 322 shown in FIG. 3). Panel 706 has a bottom surface that is slightly curved (in comparison with the bottom surfaces of the panels in FIGS. 9A and 10A), and the vacuum suction holes 702 are distributed on the curved panel surface 710 evenly or unevenly. Rod 704 of detachment apparatus 700 is mechanically coupled to and configured to hold panel 706 at a first end of the rod. Rod 704 also includes a second end opposing the first end, and panel 706 and rod 704 are configured to rotate with respect to a rotation axis (e.g., a rotation shaft 708). Rotation shaft 708 passes the second end of rod 704 and is optionally parallel to the curved bottom surface of the panel. Panel 706 is configured for contacting a top surface 210 of flexible substrate 202, applying force at the plurality of suction locations corresponding to the plurality of vacuum suction holes 702 or cups, and peeling flexible substrate 202 off rigid carrier 204.

In some embodiments, rotation shaft 708 is fixed (but still could rotate with respect to its own center). Panel 706 and rod 704 are configured to rotate with respect to rotation shaft 708 while panel 706 holds flexible substrate 202 via vacuum suction at the vacuum suction holes 702. The curved bottom surface of panel 706 has a radius of curvature that is substantially equal to a distance L from panel surface 710 to a center of rotation shaft 708 (which is approximately equal to a length of rod 704). While flexible substrate 202 is detached from rigid carrier 204, rigid carrier 202 is configured to move horizontally, thereby facilitating peeling off flexible substrate 202 off rigid carrier 204 by panel 706 having a substantially curved panel surface 710.

In some embodiments, rotation shaft 708 is not fixed, but configured to move horizontally or vertically when panel 706 and rod 704 rotate with respect to rotation shaft 708. The curved bottom surface of panel 706 has a radius of curvature that is substantially greater than the distance L from panel surface 710 to the center of rotation shaft 708 (which is approximately equal to the length of rod 704). While flexible substrate 202 is detached from rigid carrier 204, rotation shaft 708 moves accordingly, and rigid carrier 204 is also configured to move horizontally (or vertically as needed), thereby facilitating peeling flexible substrate 202 off rigid carrier 204 by panel 706 having a substantially curved panel surface 710.

Optionally, in accordance with a requirement of a corresponding substrate detachment process, the radius of curvature of the curved bottom surface of panel 706 is optionally constant or varies at different locations of the curved bottom surface.

In some embodiments, all of the plurality of suction holes 702 are controlled together, i.e., turned on and off at the same time. In contrast, in some embodiments, the plurality of suction holes 702 can be divided into groups, and the groups of vacuum suction holes 510 are activated at different times, for different durations and/or with different strengths to generate detachment force according to a force sequence. Referring to FIG. 7B, the plurality of suction holes 702 are grouped into five subsets of suction holes (702A, 702B, 702C, 702D and 702E), and these five subsets of suction holes are sequentially activated to apply detachment force on corresponding subareas of debonding region 208. For example, the first subset of suction holes 702A comes into contact with a first side 202A of flexible substrate 202, and applies detachment force on first side 202 before any other subset of suction holes. Then, suction hole subsets 702B-702E are sequentially enabled to generate detachment force needed to detach debonding region 208 of flexible substrate 202. During this sequential release of flexible substrate 202, the detachment apparatus is configured to control its peeling angle and corresponding peeling strength.

In some embodiments, when a subsequent subset of suction holes (e.g., subset 702C) is enabled to generate detachment force, any proceeding subset of suction holes (e.g., subsets 702A and 702B) is still enabled but only generates a holding force sufficient to hold a corresponding subarea of debonding region 208 that has been released from rigid carrier 204. This holding force for holding a released subarea of debonding region 208 could be substantially smaller than the detachment force previously generated by the same subset of suction holes for detaching the subarea of debonding region 208.

Figure 8:
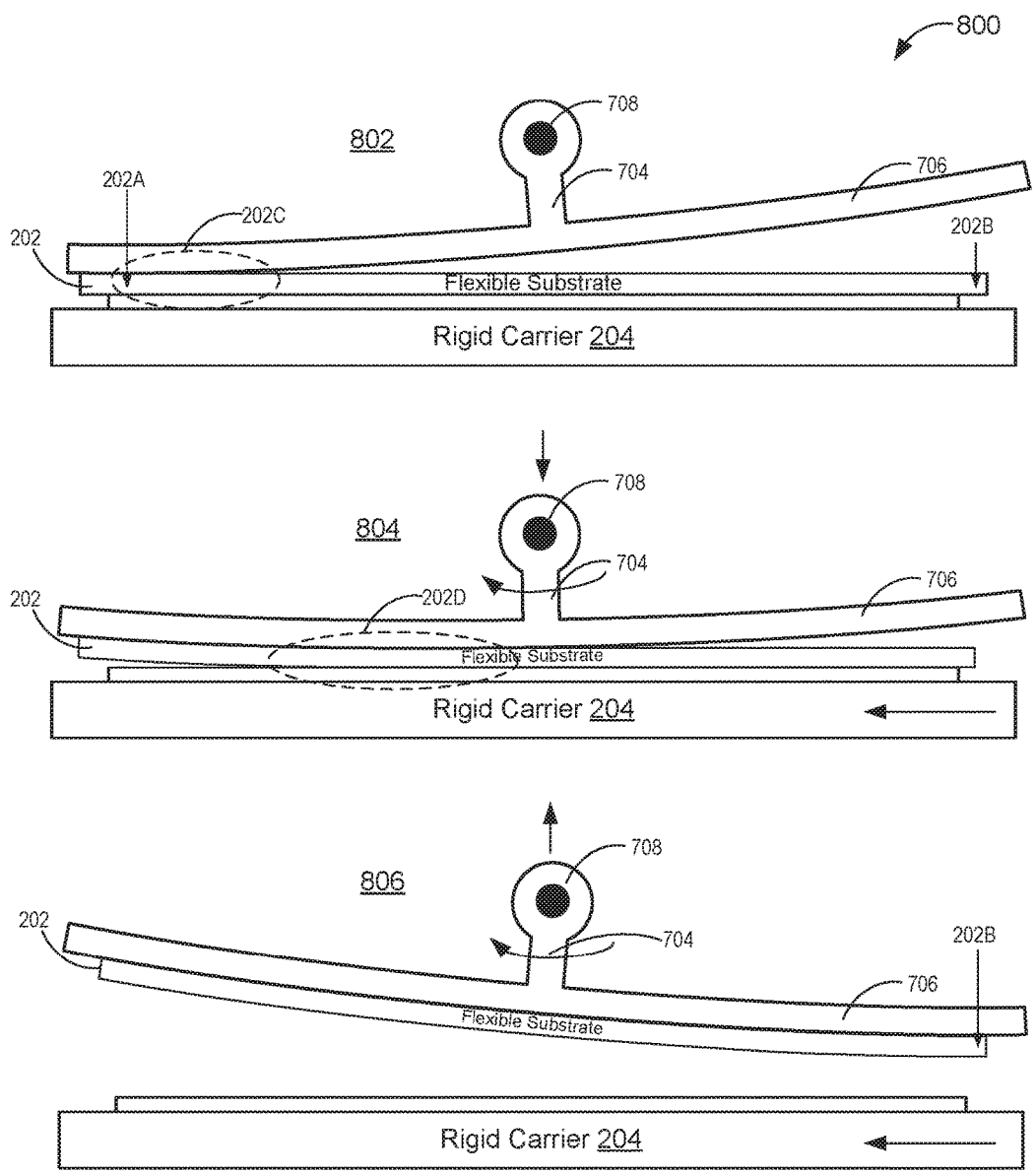
FIG. 8 is a flow diagram of an example process of manufacturing a flexible substrate using a detachment apparatus tool that includes a plurality of suction holes drilled on a curved panel surface (shown in FIGS. 7A and 7B) in accordance with some embodiments.

FIG. 8 is a flow diagram of a process 800 of manufacturing a flexible substrate using a detachment apparatus 700 that includes a plurality of suction holes 702 drilled on a curved panel surface 710 (shown in FIGS. 7A and 7B) in accordance with some embodiments. Optionally, the radius of curvature of the curved bottom surface of panel 706 is optionally constant or varying at different locations of the curved bottom surface. Flexible substrate 202 is attached to and supported by rigid substrate 204. After one or more edge regions 206 of flexible substrate are detached from rigid carrier 204, a first end of curved panel surface 710 of detachment apparatus 700 comes into contact (802) with a first sub-region 202C of flexible substrate 202 that includes or is adjacent to a first side 202A of flexible substrate 202. In the meantime, curved panel surface 710 is suspended above the other regions and a second side 202B of flexible substrate 202. Air is then pumped away from a first subset of suction holes 702A that has come into touch with the first sub-region 202C, thereby pulling first sub-region 202C of flexible substrate 202 towards detachment apparatus 700.

Then, when panel 706 and rod 704 are rotated with respect to rotation shaft 708, detachment force is applied on first sub-region 202C of flexible substrate 202 to peel it off rigid carrier 204. After first sub-region 202C is lifted up, curved panel surface 710 comes into contact (804) with a second sub-region 202D of flexible substrate 202 located next to first sub-region 202C. Air is then pumped away from a second subset of suction holes 702B that has come into touch with the second sub-region 202D of flexible substrate 202. Optionally, at this time instant, the first subset of suction holes 702A is enabled but only generates a holding force sufficient to hold first sub-region 202C of debonding region 208 that has been released from rigid carrier 204. This holding force is the same or substantially smaller than the detachment force previously generated by the same subset of suction holes for detaching first sub-region 202C.

When panel 706 and rod 704 continue to rotate with respect to rotation shaft 708, second sub-region 202D is also detached from rigid substrate 204. This process is then repeated to detach (806) other regions of debonding region 208 of flexible substrate 202 from rigid substrate 204 completely, when the detachment and holding forces are sequentially applied on the other regions. In some embodiments, rotation shaft 708 is not fixed, but configured to move horizontally or vertically when panel 706 and rod 704 rotate with respect to rotation shaft 708. Specifically, during the course of detaching flexible substrate 202 from rigid carrier 204, rotation shaft 708 moves accordingly, and rigid carrier 204 is also configured to move horizontally, thereby facilitating peeling off flexible substrate 202 off rigid carrier 204 by detachment apparatus 700 having the substantially curved panel surface 710. In some embodiments, a substantially constant peeling angle is enabled by one or more of rotation of curved panel surface 710, movement of rigid carrier 204 and movement of rotation shaft 708.

Figure 9A:
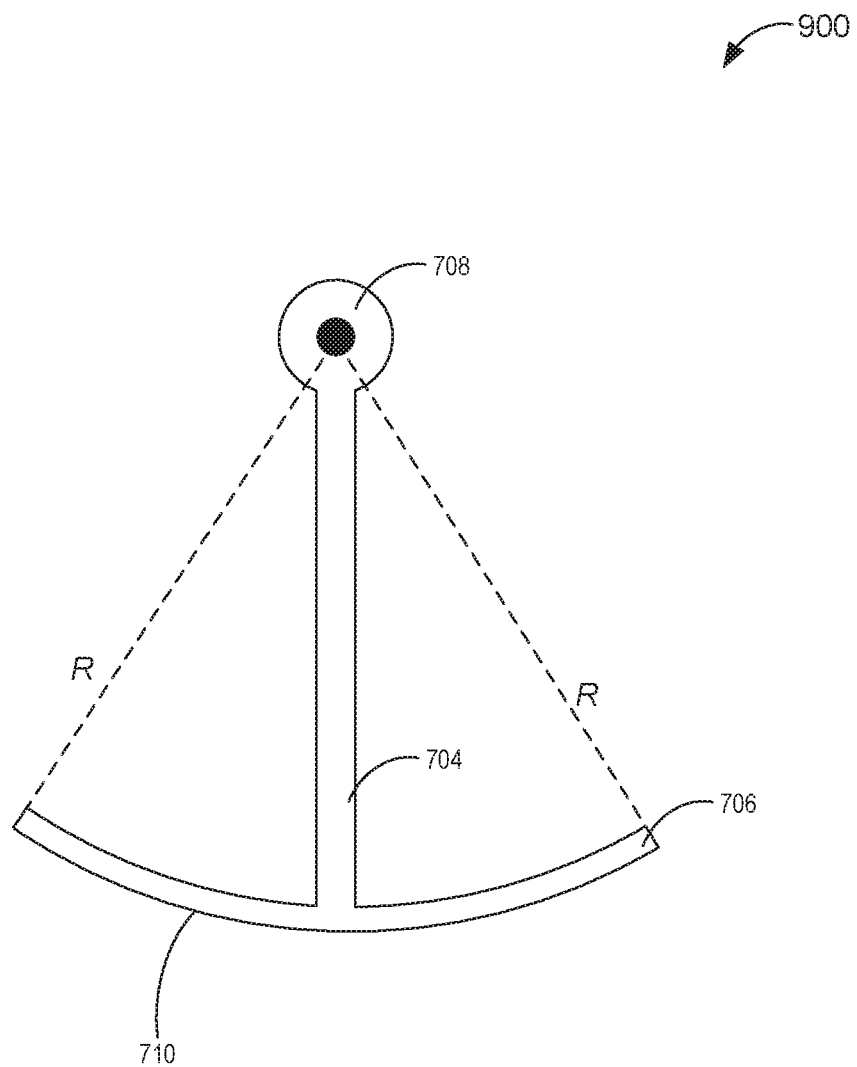
FIG. 9A is a side view of an example detachment apparatus having a fixed rotation shaft in accordance with some embodiments.
Figure 9B:
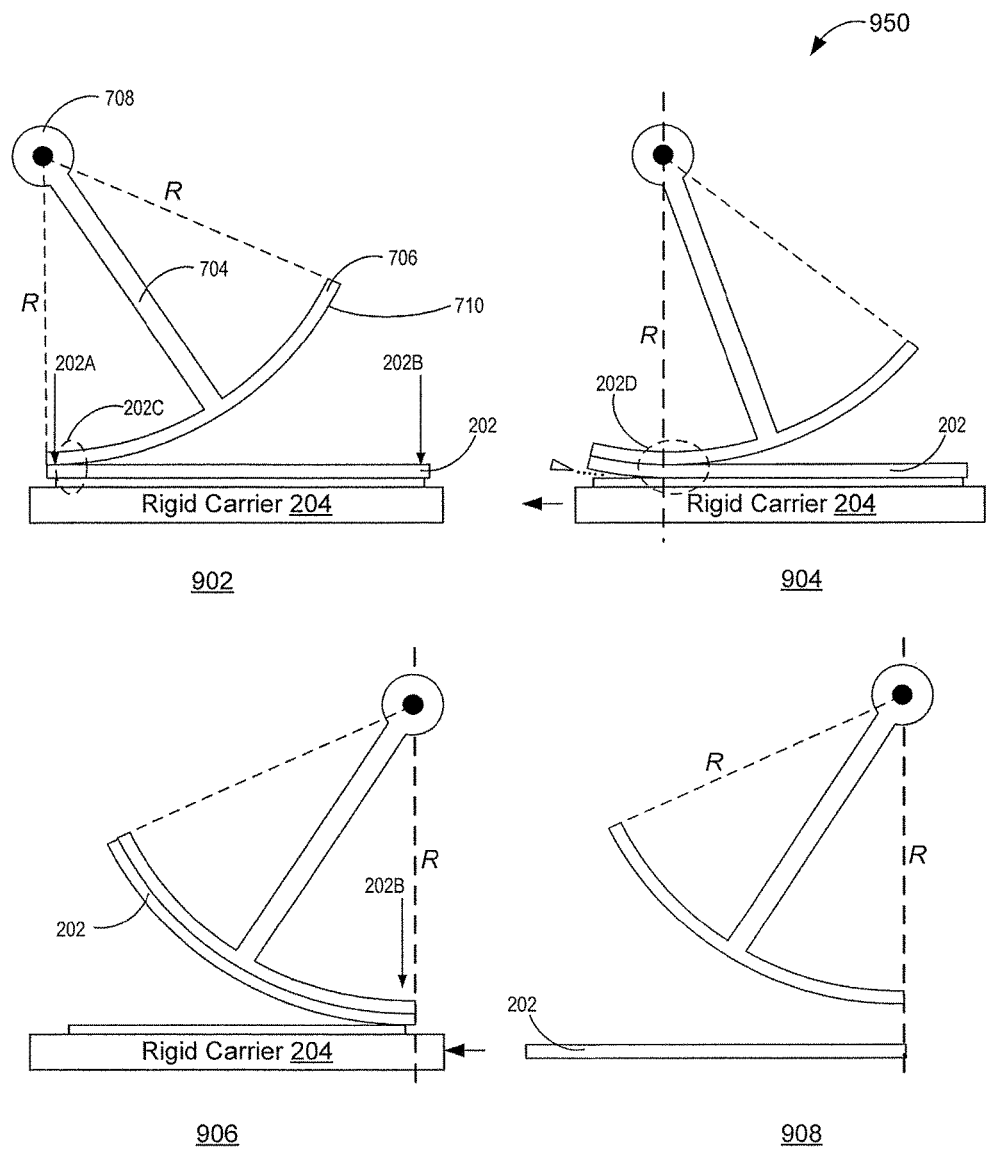
FIG. 9B is a flow diagram of a process of manufacturing a flexible substrate using the detachment apparatus having the fixed rotation shaft (shown in FIG. 9A) in accordance with some embodiments.

FIG. 9A is a side view of a detachment apparatus 900 having a fixed rotation shaft 708 in accordance with some embodiments, and FIG. 9B is a flow diagram of a process 950 of manufacturing a flexible substrate 202 using the detachment apparatus 900 having the fixed rotation shaft (shown in FIG. 9A) in accordance with some embodiments. Referring to FIG. 9A, the detachment apparatus 900 includes a rod 704 in addition to a panel 706 or a plurality of vacuum suction pads (e.g., suction pads 322 shown in FIG. 3). Rod 704 of detachment apparatus 900 is mechanically coupled to and configured to hold panel 706 at a first end of rod 704. Rod 704 also includes a second end opposing the first end coupled to rotation shaft 708. Rotation shaft 708 passes the second end of rod 704, and is substantially parallel to the curved panel surface 710 of the panel in some embodiments. Panel 706 and rod 704 are configured to rotate with respect to a rotation axis (e.g., the fixed rotation shaft 708). Panel 706 has a bottom surface 710 that is substantially curved, and a plurality of vacuum suction holes 702 are distributed on the curved panel surface 710 evenly or unevenly. In some embodiments, the curved panel surface 710 has a substantially constant radius of curvature R at different location of the curved bottom surface. The constant radius of curvature R is substantially equal to a distance L from panel surface 710 to a center of rotation, i.e., a center of rotation shaft 708, and the distance L is approximately equal to a length of rod 704. Stated another way, the center of rotation shaft 708 coincides with the center of rotation of rod 704 and panel 706, thereby guaranteeing a good contact between flexible substrate 202 and the curved panel surface 710.

Flexible substrate 202 is attached to and supported by rigid substrate 204. After one or more edge regions 206 is detached from rigid substrate 204, curved panel surface 710 of detachment apparatus 700 comes into contact (902) with a first sub-region 202C of flexible substrate 202 that includes or is adjacent to a first side 202A of flexible substrate 202. In the meantime, curved panel surface 710 is suspended above other regions and a second side 202B of flexible substrate 202. Air is then pumped away from at least a first subset of suction holes 702A that has come into touch with the first sub-region 202C, thereby pulling first sub-region 202C of flexible substrate 202 towards to detachment apparatus 700. In some embodiments, a debonding chemical is injected under the one or more edge regions 206 and into an interface between rigid carrier 204 and debonding region 208 of flexible substrate 202 to facilitate detachment of first sub-region 202C of flexible substrate 202.

When panel 706 and rod 704 are rotated with respect to rotation shaft 708, detachment force is generated and applied on first sub-region 202C of flexible substrate 202 to peel it off rigid carrier 204. After first sub-region 202C is lifted up, curved panel surface 710 comes into contact (904) with a second sub-region 202D of flexible substrate 202 located next to first sub-region 202C. Air is then pumped away from a second subset of suction holes 702B that has come into touch with the second sub-region 202D of flexible substrate 202. At this time instant, the first subset of suction holes 702A is still enabled to generate a holding force sufficient to hold first sub-region 202C of debonding region 208 that has been released from rigid carrier 204. This holding force is the same or substantially smaller than the detachment force previously generated by the same subset of suction holes for detaching first sub-region 202C. In some embodiments, the debonding chemical is injected under the exposed first sub-region 202C of flexible substrate 202 to facilitate detachment of flexible substrate 202.

When panel 706 and rod 704 continue to rotate with respect to rotation shaft 708, second sub-region 202D is also detached from rigid substrate 204. This process is then repeated to detach (906) other regions of debonding region 208 of flexible substrate 202 from rigid substrate 204 completely, when the detachment and holding forces are sequentially applied on the other regions. When flexible substrate 202 is completely detached from rigid carrier 204, the detachment force is removed (908) from the plurality of suction pads 322 (for example, by discontinuing vacuum suction or blowing air through the plurality of suction holes 702 on the curved panel surface 710). Referring to FIG. 9B, during the course of detaching flexible substrate 202 from rigid carrier 204, rotation shaft 708 is fixed (but still could rotate with respect to its own center), and rigid carrier 204 is configured to move horizontally, vertically or on both directions, thereby facilitating peeling off flexible substrate 202 off rigid carrier 204 by detachment apparatus 700 having the substantially curved panel surface 710. In some embodiments, a substantially constant peeling angle is enabled by one or more of rotation of curved panel surface 710, movement of rigid carrier 204 and movement of rotation shaft 708.

In some embodiments, when flexible substrate 202 is completely detached from rigid carrier 204, air/gas is blown through the vacuum suction holes of the curved panel surface 710 to facilitate release and eliminate electrostatic attaching effect. Then, when another flexible substrate 202 needs to be detached from rigid carrier 204, rod 704 and panel 706 are swung back to an initial position (902). The process 950 of manufacturing flexible substrate 202 is repeated on this new flexible substrate 202 until it is completely released from rigid carrier 204.

Figure 10A:
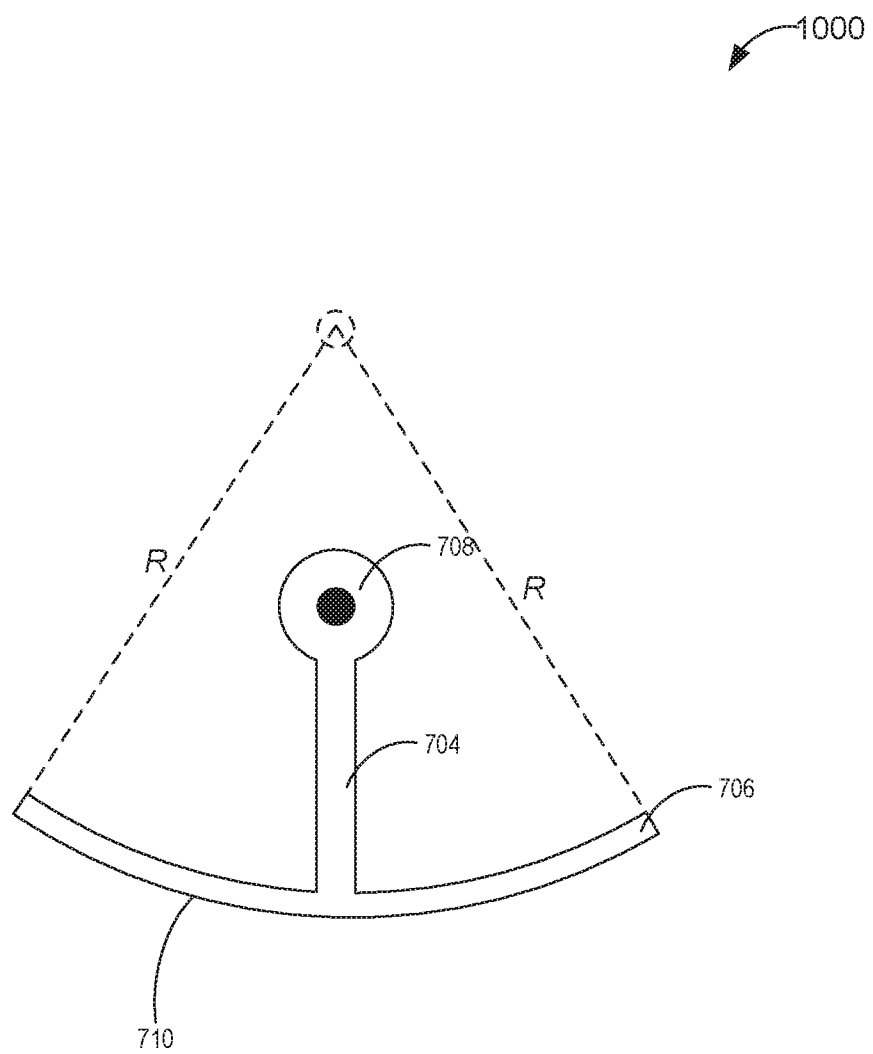
FIG. 10A is a side view of an example detachment apparatus having a moveable rotation shaft in accordance with some embodiments.
Figure 10B:
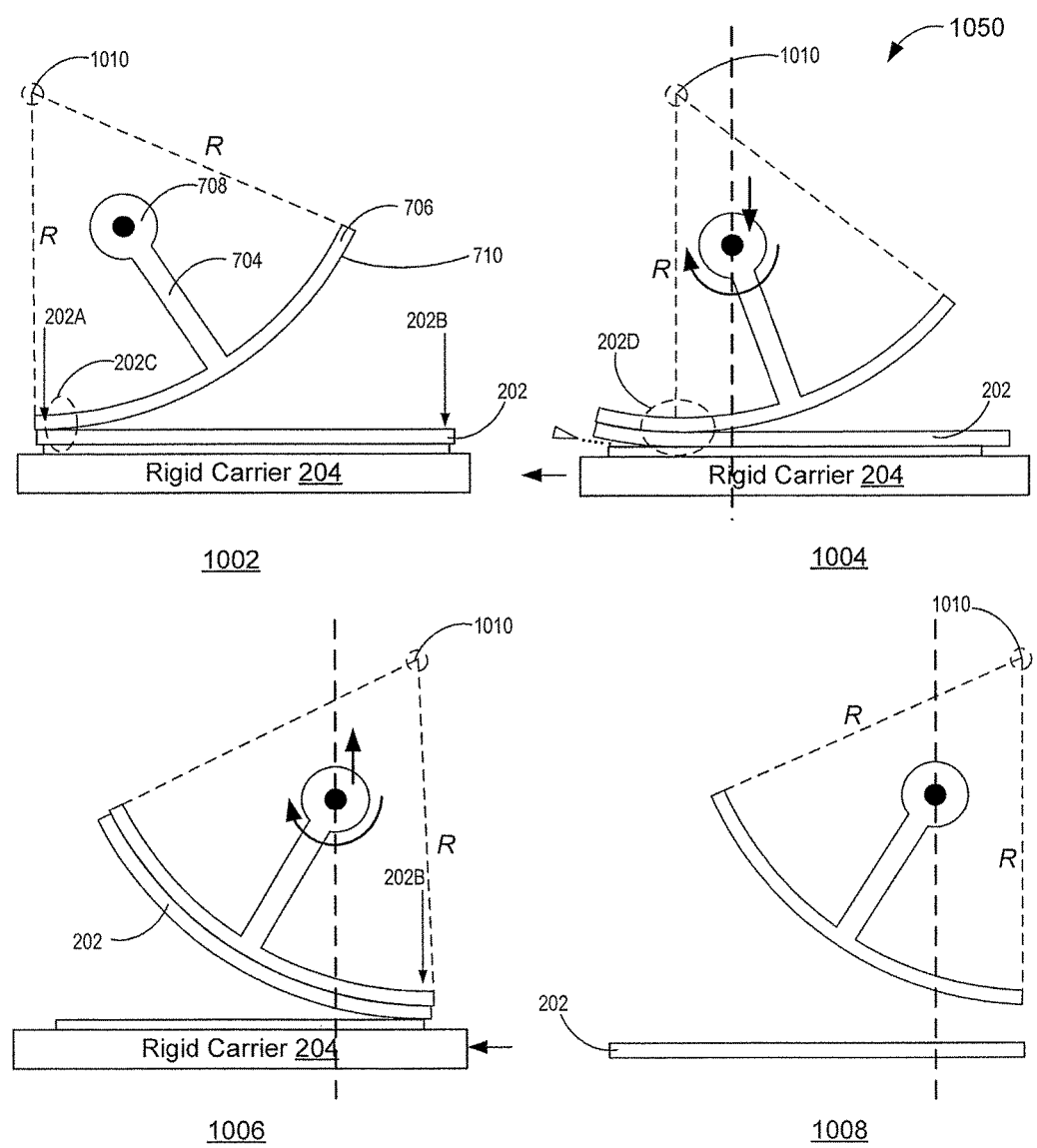
FIG. 10B is a flow diagram of a process of manufacturing a flexible substrate using the detachment apparatus having the moveable rotation shaft (shown in FIG. 10A) in accordance with some embodiments.

FIG. 10A is a side view of a detachment apparatus 1000 having a moveable rotation shaft in accordance with some embodiments, and FIG. 10B is a flow diagram of a process 1050 of manufacturing a flexible substrate 202 using the detachment apparatus 1000 having the moveable rotation shaft (shown in FIG. 10A) in accordance with some embodiments. Referring to FIG. 10A, the detachment apparatus 1000 includes a rod 704 in addition to a panel 706 or a plurality of vacuum suction pads (e.g., suction pads 322 shown in FIG. 3). Rod 704 of detachment apparatus 900 is mechanically coupled to and configured to hold panel 706 at a first end of rod 704. Rod 704 also includes a second end opposing the first end coupled to rotation shaft 708. Rotation shaft 708 passes the second end of rod 704, and is optionally parallel to the curved panel surface 710 of the panel in some embodiments. Panel 706 and rod 704 are configured to rotate with respect to rotation shaft 708. Panel 706 has a bottom surface 710 that is substantially curved and includes a plurality of vacuum suction holes 702. The vacuum suction holes 702 are distributed on the curved panel surface 710 evenly or unevenly.

In some embodiments, the curved panel surface 710 has a substantially constant radius of curvature R at different location of the curved bottom surface. The constant radius of curvature R is greater than a distance L from panel surface 710 to a center of rotation shaft 708 (which is approximately equal to a length of rod 704). The constant radius of curvature R is equal to a distance measured from a center 1010 of rotation to every node on the curved panel surface 710. The center of rotation shaft 708 does not coincide with the center of rotation 1010 of rod 704 and panel 706. In some embodiments, during the course of detaching flexible substrate 202 (FIG. 10B), the center of rotation 1010 is fixed while rotation shaft 708 is moving horizontally, vertically or in both directions (e.g., rotating with respect to the center 1010). Compared with detachment apparatus 900, detachment apparatus 1000 has a substantially smaller form factor when dimensions of their panels have an identical size.

Generally, process 1050 of manufacturing flexible substrate 202 is substantially similar to process 950 as described above with reference to FIG. 9B. When panel 706 and rod 704 rotate with respect to rotation shaft 708, curved panel surface 710 rolls over first sub-region 202B, second sub-region 202D and other regions of debonding region 208 of debonding region 208 from first side 202A to second side 202B. The first, second and other regions of flexible substrate 202 are thereby sequentially detached (1002, 1004 and 1006) from rigid carrier 204. When flexible substrate 202 is completely detached from rigid carrier 204, detachment force is removed (1008) from the plurality of suction pads 322 (for example, by discontinuing vacuum suction or blowing air through the plurality of suction holes 702 on the curved panel surface 710).

However, unlike process 950 of manufacturing flexible substrate 202, process 1050 could involve a moveable rotation shaft 708 that is configured to move horizontally, vertically or in both directions (e.g., rotate with respect to the center 1010). Even if rotation shaft 708 could be fixed in some implementations, rigid carrier 204 has to be moved both horizontally and vertically to facilitate detachment of flexible substrate 202. For example, referring to FIG. 10B, as rod 704 and panel 706 rotate with respect to rotation shaft 708, rigid carrier 204 is moving horizontally, and rotation shaft 708 has to move horizontally, vertically or on both directions for the purposes of facilitating peeling off flexible substrate 202 off rigid carrier 204 by guaranteeing a good contact between curved panel surface 710 and flexible substrate 202. Alternatively, in some other embodiments, as rod 704 and panel 706 rotate with respect to rotation shaft 708, rotation shaft 708 could also be fixed (except for its rotation), and therefore, rigid carrier 204 needs to move both horizontally and vertically.

It is noted that in some embodiments, there is no clear-cut borderline between two adjacent sub-regions of flexible substrate 202. Rather, the first and second sub-regions are merely used to ease explanation of the corresponding process (e.g., processes 800, 950 and 1050) of manufacturing a flexible substrate using a detachment apparatus that includes a plurality of suction holes drilled on its panel surface. Thus, when panel 706 and rod 704 rotate with respect to rotation shaft 708, curved panel surface 710 continuously rolls over top surface 210 of debonding region 208 from first side 202A to second side 202B, thereby peeling flexible substrate 202 off rigid carrier 204.

Figure 11:
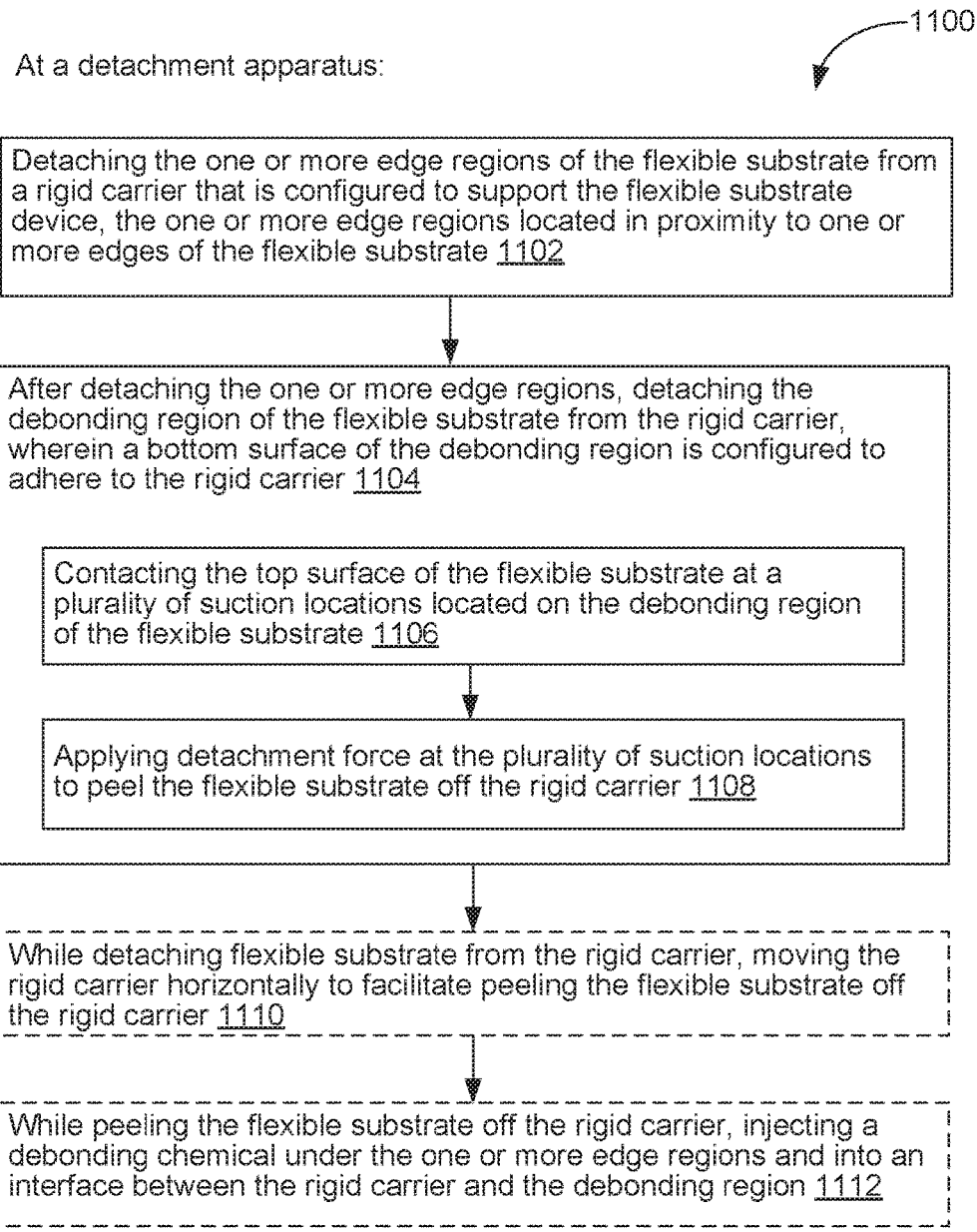
FIG. 11 is a flow diagram of an example method of forming a flexible substrate in accordance with some embodiments.

FIG. 11 is a flow diagram of a method 1100 of forming a flexible substrate (e.g., flexible substrate 202) in accordance with some embodiments. Flexible substrate 202 includes a debonding region 208 and one or more edge regions 206. A detachment apparatus (e.g., detachment apparatuses 320, 520, 700, 900 and 1000) detaches (1102) the one or more edge regions 206 of flexible substrate 202 from a rigid carrier 204 that is configured to support flexible substrate 202. The one or more edge regions 206 are located in proximity to one or more edges of flexible substrate 202. In some embodiments, the one or more edge regions 206 of flexible substrate 202 are detached from rigid carrier 204 by laser liftoff. In some embodiments, detaching the one or more edge regions 206 of flexible substrate 202 from rigid carrier 204 further includes cutting an opening on the one or more edge regions to expose an interface between the flexible substrate and the rigid carrier, and injecting a debonding chemical into the opening cut on the one or more edge regions 206.

After detaching the one or more edge regions 206, the detachment apparatus detaches (1104) debonding region 208 of flexible substrate 202 from rigid carrier 204. A bottom surface 220 of debonding region 208 is configured to adhere to rigid carrier 204. Specifically, the detachment apparatus detaches debonding region 208 by contacting (1106) top surface 210 of flexible substrate 202 at a plurality of suction locations located on debonding region 208 of flexible substrate 202, and applying (1108) detachment force at the plurality of suction locations to peel flexible substrate 202 off rigid carrier 204. Referring to FIG. 4, the plurality of suction locations is evenly or unevenly distributed across debonding region 208 of flexible substrate 202. In some embodiments, the one or more edge regions 206 of flexible substrate 202 are detached from rigid carrier 204 by sharp blade peeling from the edge.

In some embodiments, while flexible substrate 202 is detached from the rigid carrier 204, rigid carrier 204 is moved (1110) to facilitate peeling the flexible substrate off the rigid carrier. For example, rigid carrier 204 could be moved horizontally to facilitate substrate detachment. Further, in some embodiments, while flexible substrate 202 is peeled off rigid carrier 204, a debonding chemical is injected (1112) under the one or more edge regions 206 and into an interface between rigid carrier 204 and debonding region 208 of flexible substrate 202. Further, in some embodiments, while the detachment force is applied at the plurality of suction locations, flexible substrate 202 is held at the one or more edge regions 206 to facilitate peeling flexible substrate 202 off rigid carrier 204.

Alternatively, in some embodiments, the detachment apparatus includes a plurality of suction pads each including at least one of the plurality of vacuum suction holes. In some embodiments, the detachment apparatus includes a plurality of vacuum suction holes corresponding to the plurality of suction locations. More specifically, the detachment apparatus may include a flat panel for vacuum suction, and the flat panel includes the plurality of vacuum suction holes that are evenly or unevenly distributed across a bottom surface of the flat panel. Alternatively, in some embodiments, the detachment apparatus includes a panel for vacuum suction, and the panel further includes a curved bottom surface and the plurality of vacuum suction holes that are evenly or unevenly distributed across the curved bottom surface of the panel.

In some embodiments, when the detachment force is applied by the plurality of vacuum suction holes formed on the bottom surface of the panel or by the plurality of vacuum suction holes, it is applied on the plurality of suction locations sequentially from a first side to a second side of the flexible substrate, and the flexible substrate is peeled off the rigid carrier gradually from the first side to the second side.

In some embodiments, the bottom surface of the debonding region is covered with a debonding layer and configured to adhere to the rigid carrier via at least the debonding layer. Optionally, the debonding layer includes an adhesion reducing material to reduce adhesion strength between the rigid carrier and the debonding region of the flexible substrate. More specifically, in an example, the debonding layer is made of a metallic material configured to adhere to an inorganic material layer coated on the rigid carrier. In another example, the debonding layer is made of an inorganic material configured to adhere to a metallic layer coated on the rigid carrier, and the inorganic material could be one of spin-on-glass, silicon oxynitride, silicon oxide, spin-on-dielectric and silicon nitride. It is understood that in accordance with various embodiments of the application, the debonding layer is optionally applied to couple the debonding region to the rigid carrier. When the debonding layer is applied, it is optionally detached with flexible substrate 202 or remains on the top surface of rigid carrier 204.

Further, in some embodiments, the debonding region further includes a first adhesion control layer coupled between the debonding layer and a polymeric material of the flexible substrate. Examples of the first adhesion control layer include, but are not limited to a dielectric layer, a metal oxide layer, a self assembled layer, an adhesion promoter, a metal layer and a combination thereof. More details on the debonding region 208 and the one or more edge regions 206 are discussed above with reference to FIGS. 2A, 2B and 2C.

In accordance with various embodiments of the application, the detachment apparatus further includes a rod in addition to a panel having a plurality of vacuum suction holes or a plurality of vacuum suction pads. The panel has a bottom surface that could be substantially curved or flat, and the vacuum suction holes could be distributed on the bottom surface evenly or unevenly. The rod of the detachment apparatus is mechanically coupled to and configured to hold the panel at a first end of the rod. The rod also includes a second end opposing the first end, and the panel and the rod are configured to rotate with respect to a rotation axis (e.g., a rotation shaft) that passes the second end and is substantially parallel to the curved bottom surface of the panel. As described above, the panel is configured for contacting a top surface of the flexible substrate, applying force at the plurality of suction locations corresponding to the plurality of vacuum suction holes or cups, and peeling the flexible substrate off from the rigid carrier.

In some embodiments, the rotation shaft is fixed, and the panel and the rod are configured to rotate with respect to the rotation shaft while the panel holds the flexible substrate via vacuum suction at the vacuum suction holes. While the flexible substrate is detached from the rigid carrier, the rigid carrier is configured to move horizontally to facilitate peeling off the flexible substrate off the rigid carrier. In some situations, if the bottom surface of the panel is curved, the curved bottom surface of the panel has a radius of curvature that is substantially equal to the length of the rod.

In some embodiments, the rotation shaft is not fixed, but configured to move horizontally or vertically when the panel and the rod rotate with respect to the rotation shaft. In this situation, if the bottom surface of the panel is curved, the curved bottom surface of the panel has a radius of curvature that is greater than the length of the rod. Further, in some embodiments, the rotation shaft is not fixed, and while detaching the flexible substrate from the rigid carrier, the rotation shaft moves accordingly, and the rigid carrier is configured to move horizontally to facilitate peeling off the flexible substrate off the rigid carrier.

In various embodiments of this application, when detachment force is applied on the plurality of suction locations of a flexible substrate, it is distributed across these suction locations, rather than being focused on a limited number of points on an edge of the flexible substrate. This distributed detachment force helps guarantee the yield of the flexible substrate and the quality of display devices formed thereon. Thus, this application has offered a solution to an apparatus that facilitates detachment a flexible substrate from a rigid carrier while not compromising the yield of the flexible substrate and the quality of display devices formed thereon during a display manufacturing process.

It should be understood that the flexible substrate devices described in this application are merely exemplary and are not intended to indicate that they are the only flexible substrate devices that can be implemented in this application. It should also be understood that the detachment apparatuses described in this application are merely exemplary and are not intended to indicate that they are the only detachment apparatuses that can be implemented in this application. One of ordinary skill in the art would recognize various ways to form a flexible substrate device using a detachment apparatus as described herein. Additionally, it should be noted that details of the flexible substrate device and the detachment apparatus described herein with respect to any one of FIGS. 3-11 are applicable in an analogous manner to other flexible substrate devices and detachment devices described herein with respect to any other figures of FIGS. 3-11. For brevity, these details are not repeated.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

Reference has been made in detail to implementations, examples of which are illustrated in the accompanying drawings. In the detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, mechanical structures, circuits, and networks have not been described in detail so as not to unnecessarily obscure aspects of the implementations.

It will also be understood that, although the terms first, second, etc. are, in some instances, used herein to describe various elements, these elements should not be limited by these terms. These terms are only used to distinguish one element from another. For example, a first fastener structure can be termed a second fastener structure, and, similarly, a second fastener structure can be termed a first fastener structure, without departing from the scope of the various described implementations. The first fastener structure and the second fastener structure are both fastener structures, but they are not the same fastener structure.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, components, structures and/or groups, but do not preclude the presence or addition of one or more other features, integers, steps, operations, elements, components, structures, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

It is noted that the flexible substrate devices described herein are exemplary and are not intended to be limiting. For example, any dimensions, shapes, profiles, and/or materials described herein are exemplary and are not intended to be limiting. Drawings are not to scale. For brevity, features or characters described in association with some implementations may not necessarily be repeated or reiterated when describing other implementations. Even though it may not be explicitly described therein, a feature or characteristic described in association with some implementations may be used by other implementations.

What is claimed is:

1. A method of forming a flexible substrate, wherein the flexible substrate includes a debonding region and one or more edge regions, comprising:
   detaching the one or more edge regions of the flexible substrate from a rigid carrier that is configured to support the flexible substrate, the one or more edge regions located in proximity to one or more edges of the flexible substrate; and
   after detaching the one or more edge regions, detaching by a detachment apparatus the debonding region of the flexible substrate from the rigid carrier, wherein a bottom surface of the debonding region is configured to adhere to the rigid carrier, wherein the detachment apparatus includes a panel having a plurality of vacuum suction holes distributed across a bottom surface of the panel, including:
      contacting the top surface of the flexible substrate at a plurality of suction locations located on the debonding region of the flexible substrate using the plurality of vacuum suction holes of the panel; and
      applying detachment force at the plurality of suction locations to peel the flexible substrate off the rigid carrier;
   wherein the detachment apparatus further includes a rod mechanically coupled to the panel and configured to hold the panel at a first end of the rod and a rotation shaft mechanically coupled to the rod and configured to hold the rod at a second end of the rod; and
   the rotation shaft is fixed, and the panel and the rod are configured to rotate with respect to the rotation shaft while the panel holds the flexible substrate via vacuum suction at the plurality of vacuum suction holes.

2. The method of claim 1, wherein the plurality of suction locations are evenly distributed across the debonding region of the flexible substrate.

3. The method of claim 1, wherein the plurality of suction locations are not evenly distributed across the debonding region of the flexible substrate.

4. The method of claim 1, wherein the detachment apparatus includes a plurality of vacuum suction holes corresponding to the plurality of suction locations.

5. The method of claim 4, wherein the panel further includes a curved bottom surface, and the plurality of vacuum suction holes are distributed across the curved bottom surface of the panel.

6. The method of claim 1, further comprising:
while detaching the flexible substrate from the rigid carrier, moving the rigid carrier to facilitate peeling the flexible substrate off the rigid carrier.

7. The method of claim 6, wherein the rigid carrier is moved horizontally to facilitate peeling the flexible substrate off the rigid carrier.

8. The method of claim 1, wherein the detachment force is applied by the panel on the plurality of suction locations sequentially from a first side to a second side of the flexible substrate, and the flexible substrate is peeled off the rigid carrier gradually from the first side to the second side.

9. The method of claim 1, further comprising:
while peeling the flexible substrate off the rigid carrier, injecting a debonding chemical under the one or more edge regions and into an interface between the rigid carrier and the debonding region.

10. The method of claim 1, wherein while the detachment force is applied at the plurality of suction locations, the flexible substrate is held at the one or more edge regions to facilitate peeling the flexible substrate off the rigid carrier.

11. The method of claim 1, wherein the one or more edge regions of the flexible substrate are detached from the rigid carrier at least partially by laser liftoff.

12. The method of claim 1, wherein detaching the one or more edge regions of the flexible substrate from the rigid carrier further includes:
cutting an opening on the one or more edge regions to expose an interface between the flexible substrate and the rigid carrier; and
injecting a debonding chemical into the opening cut on the one or more edge region.

13. The method of claim 1, wherein the bottom surface of the debonding region is covered with a debonding layer and configured to adhere to the rigid carrier via at least the debonding layer.

14. A detachment apparatus for flexible substrate detachment, comprising:
a panel configured for vacuum suction and including a plurality of vacuum suction holes located on a bottom surface of the panel, wherein the plurality of vacuum suction holes are distributed across the bottom surface of the panel;
a rod mechanically coupled to the panel and configured to hold the panel at a first end of the rod, the rod further includes a second end opposing the first end; and
a rotation shaft mechanically coupled to the rod at the second end and configured to hold the rod at the second end;
wherein the panel is configured for:
contacting a top surface of a flexible substrate;
applying force at a plurality of suction locations on the flexible substrate corresponding to the plurality of vacuum suction holes; and
peeling the flexible substrate off from a rigid carrier; and
wherein the rotation shaft is fixed, and the panel and the rod are configured to rotate with respect to the rotation shaft while the panel holds the flexible substrate via vacuum suction at the plurality of vacuum suction holes.

15. The detachment apparatus of claim 14, wherein the panel is configured for peeling the flexible substrate off from the rigid carrier while moving the rigid carrier that supports the flexible substrate horizontally.

16. The detachment apparatus of claim 14, wherein the vacuum suction holes are evenly distributed on the bottom surface of the panel.

17. The detachment apparatus of claim 14, wherein the rotation shaft is configured to move horizontally or vertically when the panel and the rod rotate with respect to the rotation shaft.

18. The detachment apparatus of claim 14, wherein the panel has a bottom surface that is substantially curved.

19. The detachment apparatus of claim 18, wherein the curved bottom surface of the panel has a radius of curvature that is greater than a distance between the curved bottom surface and a center of the rotation shaft.

20. The detachment apparatus of claim 19, wherein the rotation shaft is fixed, and while detaching the flexible substrate from the rigid carrier, the rigid carrier is configured to be moved horizontally to facilitate peeling off the flexible substrate off the rigid carrier.

21. The detachment apparatus of claim 20, wherein the curved bottom surface of the panel has a radius of curvature that is substantially equal to a distance between the curved bottom surface and a center of the rotation shaft.

22. The detachment apparatus of claim 14, wherein the panel of the detachment apparatus is configured to apply the force on the plurality of suction locations sequentially from a first side to a second side of the flexible substrate, thereby peeling the flexible substrate off the rigid carrier gradually from the first side to the second side.

* * * * *